(12) United States Patent
Kadoguchi et al.

(10) Patent No.: US 9,059,145 B2
(45) Date of Patent: Jun. 16, 2015

(54) POWER MODULE, METHOD FOR MANUFACTURING POWER MODULE, AND MOLDING DIE

(75) Inventors: Takuya Kadoguchi, Toyota (JP); Yoshikazu Suzuki, Toyota (JP); Tatsuya Miyoshi, Nagoya (JP); Takanori Kawashima, Anjo (JP); Tomomi Okumura, Chiryu (JP)

(73) Assignees: TOYOTA JIDOSHA KABUSHIKI KAISHA, Toyota-Shi (JP); DENSO CORPORATION, Kariya-Shi (JP)

( * ) Notice: Subject to any disclaimer, the term of this patent is extended or adjusted under 35 U.S.C. 154(b) by 111 days.

(21) Appl. No.: 13/590,707

(22) Filed: Aug. 21, 2012

(65) Prior Publication Data

US 2013/0050947 A1  Feb. 28, 2013

(30) Foreign Application Priority Data

Aug. 25, 2011  (JP) .................................. 2011-184080
Jun. 8, 2012  (JP) .................................. 2012-130772

(51) Int. Cl.
*H05K 7/20* (2006.01)
*H01L 23/433* (2006.01)
(Continued)

(52) U.S. Cl.
CPC ....... *H01L 23/4334* (2013.01); *Y10T 29/49002* (2015.01); *H01L 23/051* (2013.01);
(Continued)

(58) Field of Classification Search
CPC ......... H05K 7/2098–7/20945; H05K 7/20218; H05K 7/20254; H05K 5/00; H05K 5/0026; H05K 5/0082; H05K 5/0021; H05K 5/069; H05K 7/20; H05K 7/00; H05K 7/1422; H05K 1/0218–1/0219; H05K 1/00; H05K 3/00; H05K 9/00; H01L 23/473; G06F 1/16–1/1654; G06F 1/1656; G06F 1/1662–1/1681; G06F 1/20; G06F 1/203; G06F 1/206; G06F 2200/201; G06F 2200/202; G06F 2200/203; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00
USPC ...................... 361/679.46–679.54, 688–723; 165/80.1–80.5, 104.33, 185; 174/15.1–15.2, 16.1–16.3; 363/141; 257/712–722, E23.088
See application file for complete search history.

(56) References Cited

U.S. PATENT DOCUMENTS 6,431,259 B2 *  8/2002  Hellbruck et al. ............ 165/80.3
6,495,924 B2 * 12/2002  Kodama et al. ............... 257/785
(Continued)

FOREIGN PATENT DOCUMENTS

CN    201354373 Y    12/2009
JP    09-082882 A     3/1997
(Continued)

*Primary Examiner* — Michail V Datskovskiy
*Assistant Examiner* — Razmeen Gafur
(74) *Attorney, Agent, or Firm* — Kenyon & Kenyon LLP

(57) ABSTRACT

A power module is disclosed that includes a semiconductor element, a first cooling member and a second cooling member configured to sandwich the semiconductor element therebetween, a frame member configured to support the semiconductor element between the first cooling member and the second cooling member and molded resin disposed between the first cooling member and the second cooling member, wherein the frame member includes an adjusting member which adjusts a distance between the first cooling member and the second cooling member.

2 Claims, 11 Drawing Sheets

(51) Int. Cl.
   *H01L 23/051* (2006.01)
   *H01L 25/07* (2006.01)
   *H01L 23/473* (2006.01)
   *H01L 23/31* (2006.01)
   *H01L 21/56* (2006.01)

(52) U.S. Cl.
   CPC ............ *H01L23/3107* (2013.01); *H01L 21/565* (2013.01); *H01L 2924/0002* (2013.01); *H01L 25/071* (2013.01)

(56) References Cited

U.S. PATENT DOCUMENTS

| | | | | |
|---|---|---|---|---|
| 6,542,365 B2* | 4/2003 | Inoue | ............................. | 361/699 |
| 7,301,755 B2* | 11/2007 | Rodriguez et al. | ............ | 361/676 |
| 7,324,342 B2* | 1/2008 | Taylor et al. | ................. | 361/704 |
| 7,349,214 B2* | 3/2008 | Jeong | ............................ | 361/704 |
| 7,710,721 B2* | 5/2010 | Matsuo et al. | ................ | 361/699 |
| 7,916,481 B2* | 3/2011 | Thome et al. | ................. | 361/699 |
| 8,026,597 B2* | 9/2011 | Brandenburg et al. | ........ | 257/714 |
| 8,120,171 B2* | 2/2012 | Koike et al. | .................... | 257/719 |
| 2002/0180037 A1* | 12/2002 | Shirakawa et al. | ............ | 257/727 |
| 2004/0089941 A1* | 5/2004 | Mamitsu et al. | ............... | 257/718 |
| 2004/0159940 A1* | 8/2004 | Hiyoshi | ........................ | 257/732 |
| 2007/0296077 A1* | 12/2007 | Moline | ......................... | 257/712 |
| 2008/0224282 A1 | 9/2008 | Ashida et al. | | |
| 2008/0293261 A1 | 11/2008 | Zschieschang et al. | | |
| 2009/0116197 A1* | 5/2009 | Funakoshi et al. | ............ | 361/719 |
| 2009/0321924 A1* | 12/2009 | Funakoshi et al. | ............ | 257/722 |
| 2010/0038774 A1* | 2/2010 | Zhang et al. | .................... | 257/714 |
| 2010/0127371 A1* | 5/2010 | Tschirbs | ........................ | 257/684 |
| 2010/0155924 A1* | 6/2010 | Knapp et al. | .................. | 257/690 |
| 2010/0238627 A1* | 9/2010 | Shinohara | ...................... | 361/695 |

FOREIGN PATENT DOCUMENTS

| | | |
|---|---|---|
| JP | 2006-049542 A | 2/2006 |
| JP | 2006128259 A | 5/2006 |
| JP | 2008141053 A | 6/2008 |
| JP | 2008227131 A | 9/2008 |
| JP | 2009-071064 A | 4/2009 |

\* cited by examiner

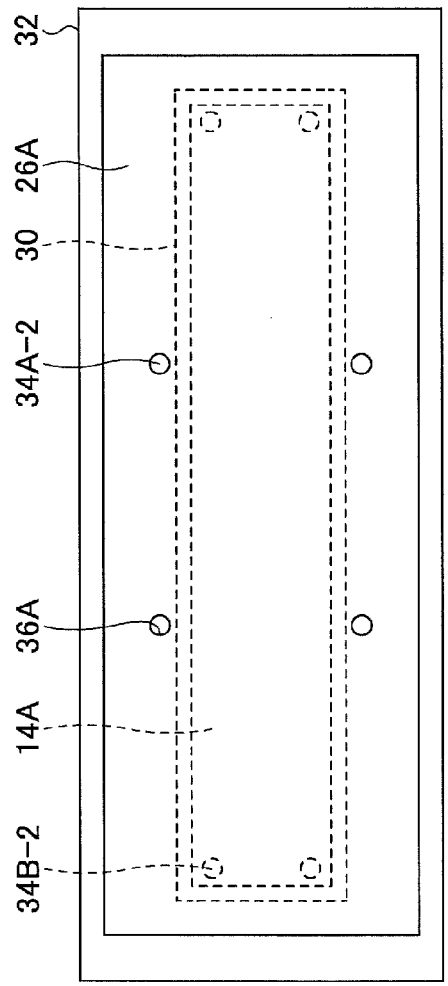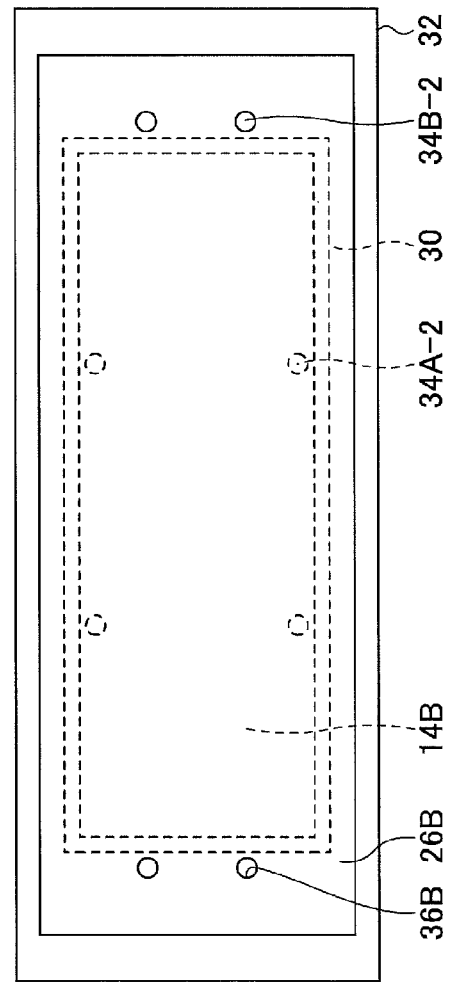

POWER MODULE, METHOD FOR MANUFACTURING POWER MODULE, AND MOLDING DIE

BACKGROUND OF THE INVENTION

1. Field of the Invention

The present invention relates to a power module which includes a semiconductor element, cooling members disposed on both surfaces of the semiconductor element, respectively, and a molded resin which seals the semiconductor element between the cooling members. The present invention also relates to a method for manufacturing the power module and a molding die used for molding the power module.

2. Description of the Related Art

Conventionally, there has been a power module including a semiconductor element molded by a resin (see, e.g., Patent Document 1). When the semiconductor element is being driven, the semiconductor element generates heat. The power module is cooled by the cooling members that are disposed on both surfaces of the semiconductor element, respectively. The power module is manufactured by supplying the resin between the two cooling members that sandwich the semiconductor element.

[Patent Document 1] Japanese Patent Application Publication No. 2006-049542

The molding process of the power module disclosed in patent document 1 is realized by supplying the resin into a molding area located between the cooling members that are held by a designated molding die. The molding area is an area in which the semiconductor element, a metal block, a solder or the like are stacked and molded by the resin. In the molding process, a dimensional tolerance which meets the dimension of the molding die is required for the molding area.

Since it is not easy for the molded resin to meet the dimensional tolerance, the resin may leak from the molding die. On the other hand, the semiconductor element, the solder or the like which is disposed in the molding area may not be held by the molding die appropriately and may be broken by a molding pressure.

SUMMARY OF THE INVENTION

It is an object of embodiments of the present invention to provide a power module, a method for manufacturing the power module and a molding die used for molding the power module that can realize dimensional management of the power module including a semiconductor element and cooling members disposed on respective sides of the semiconductor element.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor element particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a power module including a semiconductor element; a first cooling member and a second cooling member configured to sandwich the semiconductor element therebetween; a frame member configured to support the semiconductor element between the first cooling member and the second cooling member; and a molded resin disposed between the first cooling member and the second cooling member, wherein the frame member includes an adjusting member which adjusts a distance between the first cooling member and the second cooling member.

Another embodiment of the present invention provides a method of manufacturing a power module including a semiconductor element, a first cooling member and a second cooling member configured to sandwich the semiconductor element therebetween, a frame member configured to support the semiconductor element between the first cooling member and the second cooling member and configured to include an adjusting member which adjusts a distance between the first cooling member and the second cooling member, and a molded resin disposed between the first cooling member and the second cooling member, the method including: manufacturing the power module by injecting molding resin into a molding die in a state where the adjusting member is expanded or contracted by the molding die and adjusts the distance to an intended distance.

Yet another embodiment of the present invention provides a molding die used for manufacturing a power module including a semiconductor element, a first cooling member and a second cooling member configured to sandwich the semiconductor element therebetween, a frame member configured to support the semiconductor element between the first cooling member and the second cooling member and configured to include an adjusting member which adjusts a distance between the first cooling member and the second cooling member, and a molded resin disposed between the first cooling member and the second cooling member, the molding die including: a first molding body configured to hold the first cooling member during a molding process of the molded resin; a second molding body configured to hold the second cooling member during the molding process; a first pressing pin configured to extend from a side of the first molding body and to press a second metal block disposed on a side of the second cooling member; and a second pressing pin configured to extend from a side of the second molding body and to press a first metal block disposed on a side of the first cooling member, and wherein the elastic member is expanded by the first metal block which is being pressed by the second pressing pin, and by the second metal block which is being pressed by the first pressing pin during the molding process.

Other objects, features and advantages of the embodiments of the present invention will become more apparent from the following detailed description when read in conjunction with the accompanying drawings.

BRIEF DESCRIPTION OF THE DRAWINGS

FIG. 3A is a cross-sectional view of the power module and the molding die taken along a line A-A illustrated in FIG. 2;

FIG. 3B is a cross-sectional view of the power module and the molding die taken along a line B-B illustrated in FIG. 2;

DESCRIPTION OF THE PREFERRED EMBODIMENTS

In the following, embodiments of a power module, a method for manufacturing the power module and a molding die used for molding the power module of the present invention will be described by referring to the accompanying drawings.

First Embodiment

Figure 1:
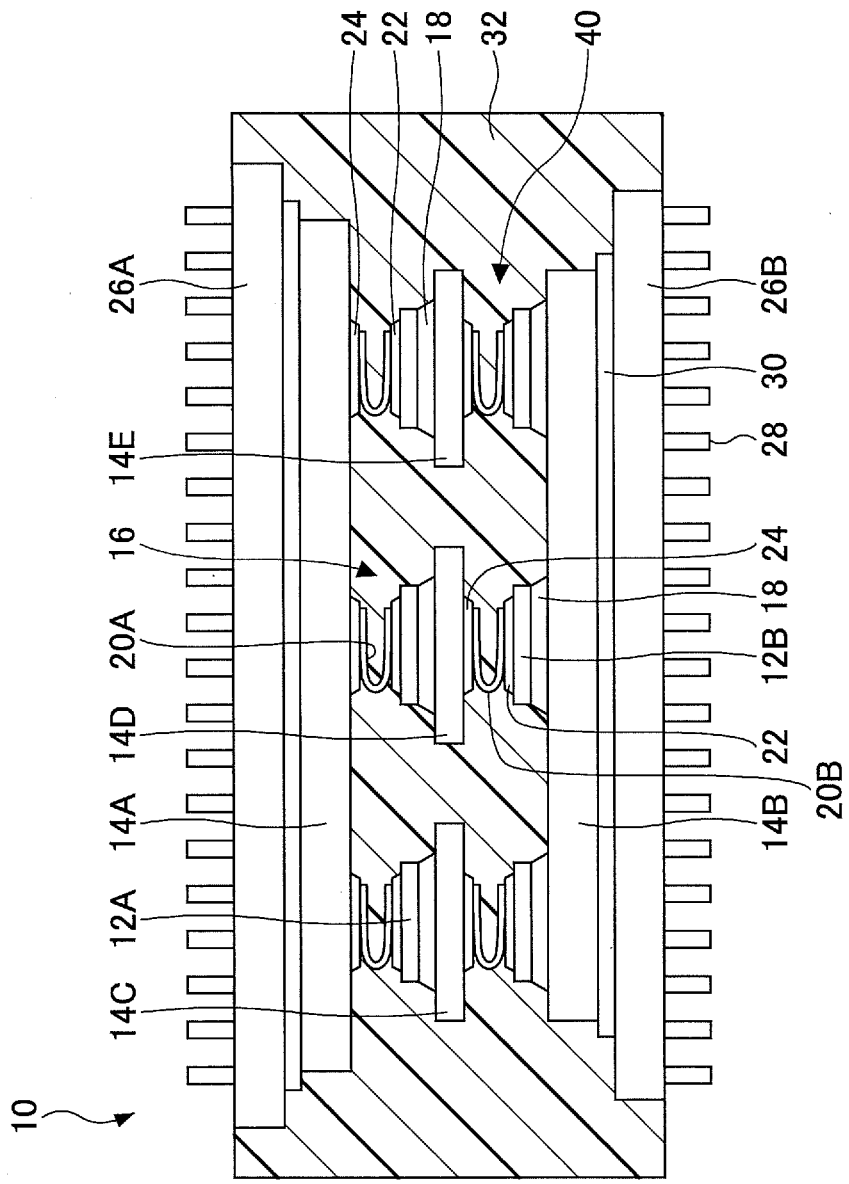
FIG. 1 is a cross-sectional view of a power module according to a first embodiment of the present invention.

FIG. 1 is a cross-sectional view of a power module 10 according to a first embodiment of the present invention. FIG. 1 illustrates a cross sectional view of the power module 10. The power module 10 according to the present embodiment is a type of a module which is included in an inverter or a voltage up/down converter which is disposed between a direct-current power source and an electric motor of a hybrid vehicle or an electric vehicle, for example.

As illustrated in FIG. 1, the power module 10 includes six semiconductor elements 12A and 12B, for example. The semiconductor elements 12A and 12B are switching elements such as Insulated Gate Bipolar Transistors (IGBTs) or the like and diodes, for example, and constitute upper arm units and lower arm units of the inverter or the voltage up/down converter. Switching operation of the switching elements are performed so that the switching elements output currents flowing through U-phase, V-phase and W-phase of the electric motor and perform stepping up and down control. The semiconductor elements 12A and 12B are connected to external terminals via bonding wires (not illustrated). Signals are supplied to the semiconductor elements 12 through the bonding wires from an external control device, and signals are output from the semiconductor elements 12A and 12B to the external control device via the bonding wires.

The power module 10 includes metal blocks 14A, 14B, 14C, 14D and 14E that are disposed close to the semiconductor elements 12A and 12B. The metal blocks 14A, 14B, 14C, 14D and 14E are made of metal having high heat transfer performance such as copper. The metal blocks 14A to 14E function as radiator plates (heat sinks) that enhance heat transfer performance of the semiconductor elements 12A and 12B and as back wirings. The metal blocks 14A and 14B have relatively large surface areas, and the metal blocks 14C, 14D and 14E have relatively small surface areas. The metal blocks 14A to 14E have designated shapes, respectively.

The metal blocks 14A and 14B having relatively large surface areas are disposed at a designated distance and opposed with each other. The metal blocks 14C, 14D and 14E having relatively small surface areas are arranged in parallel to each other between the metal blocks 14A and 14B. The metal blocks 14C, 14D and 14E are disposed almost in the middle of the metal blocks 14A and 14B and are opposed to the metal blocks 14A and 14B at designated distances. The three semiconductor elements 12A are disposed between the metal block 14A and the metal blocks 14C, 14D and 14E, respectively. The other three semiconductor elements 12B are disposed between the metal block 14B and the metal blocks 14C, 14D and 14E, respectively.

Three pairs of the semiconductor elements 12A and 12B are stacked vertically between the metal blocks 14A and 14B. Each pair of the semiconductor elements 12A and 12B is disposed and electrically connected in series between the metal blocks 14A and 14B. According to the configuration as described above, a mounting area in which the semiconductor elements 12A and 12B are disposed becomes smaller than a mounting area in which six semiconductor elements that constitute upper and lower arm units of the inverter are disposed in the same level. Thus the power module 10 is downsized. Three pairs of the semiconductor elements 12A and 12B are disposed in parallel with each other between the metal blocks 14A and 14B. Each pair of the semiconductor elements 12A and 12B is disposed in series between the metal blocks 14A and 14B. The upper three semiconductor elements 12A are disposed between the metal block 14A and the metal blocks 14C, 14D and 14E, respectively. The lower three semiconductor elements 12B are disposed between the metal block 14B and the metal blocks 14C, 14D and 14E, respectively.

The power module 10 includes six frame members 16. The upper three frame members 16 support the semiconductor elements 12A between the metal block 14A and the metal blocks 14C, 14D and 14E, respectively. The lower three frame members 16 support the semiconductor elements 12B between the metal block 14B and the metal blocks 14C, 14D and 14E, respectively. The semiconductor elements 12A are supported between the metal block 14A and the metal blocks 14C, 14D and 14E, respectively. The semiconductor elements 12B are supported between the metal block 14B and the metal blocks 14C, 14D and 14E, respectively. The semiconductor elements 12A are connected to the upper surfaces of the metal blocks 14C, 14D, and 14E by solders 18, respectively. The semiconductor elements 12B are connected to the upper surface of the metal block 14B by solders 18, respectively. The semiconductor elements 12A are connected to the upper surfaces of the metal blocks 14C, 14D and 14E via the solders 18. The semiconductor elements 12B are connected to the upper surface of the metal block 14B. The lower surfaces of the upper three semiconductor elements 12A are connected to the upper surfaces of the metal blocks 14C, 14D and 14E via the solders 18. The upper surfaces of the upper three semiconductor elements 12A are connected to the lower surface of the metal block 14A via the solders 22, the spring members 20A and the solders 24. The lower surfaces of the upper three semiconductor elements 12B are connected to the upper surfaces of the metal block 14B via the solders 18. The upper surfaces of the upper three semiconductor elements 12B are connected to the lower surface of the metal blocks 14C, 14D and 14E via the solders 22, the spring members 20B and the solders 24.

Each of the three spring members 20A constitutes a part of each of the three upper frame members 16. Each of the three spring members 20B constitutes a part of each of the three lower frame members 16. Accordingly, the upper three frame members 16 include the spring members 20A. The lower three frame members 16 include the spring members 20B. The spring members 20A and 20B have elasticity. The spring members 20A and 20B are connected in series between the metal blocks 14A and 14B. The spring members 20A and 20B are made of a metallic material having a heat transfer performance and conductivity such as copper or the like, for example.

The spring members 20A and 20B are type of elastic members that can expand and/or contract between the metal blocks 14A and 14B in a direction in which the metal blocks 14A and 14B face with each other. I.e., the spring members 20A and 20B can expand and/or contract between cooling blocks 26A and 26B in a direction in which the metal blocks 14A, 14B, 14C, 14D and 14E, the blocks 26A and 26B, and the semiconductor elements 12A and 12B are stacked with each other. The spring members 20A and 20B have configurations that are obtained by bending plates in U-shape or configurations of plate springs. The blocks 26A and 26B will be described later. In order to enhance the heat transfer performance and/or the conductivity of the spring members 20A and 20B, solders or the like may be supplied in the U-shaped spring.

Lower ends of the spring members 20A are connected to the semiconductor elements 12A via the solders 22. Lower ends of the spring members 20B are connected to the semiconductor elements 12B via the solders 22. Upper ends of the upper three spring members 20A are connected to the metal block 14A via the solders 24. Upper ends of the lower three spring members 20B are connected to the metal blocks 14C, 14D and 14E via the solders 24, respectively. The spring members 20A and 20B can adjust distances between the semiconductor elements 12A and 12B and the metal blocks 14A, 14B, 14C, 14D and 14E. Distances between the metal block 14A and the metal blocks 14C, 14D and 14E can be adjusted by expansion or contraction the spring members 20A. Distances between the metal block 14B and the metal blocks 14C, 14D and 14E can be adjusted by expansion or contraction of the spring members 20B.

The cooling block 26A is disposed onto the metal block 14A, and the cooling block 26B is disposed under the metal block 14B. The cooling blocks 26A and 26B are made of metal having high thermal conductivity such as aluminum or the like. The cooling blocks 26A and 26B have functions of conducting heat conducted from the metal blocks 14A and 14B to cooling medium such as the air by performing heat exchange. The spring members 20A are disposed between the semiconductor elements 12A and the cooling block 26A. The spring members 20A are thermally, mechanically and electrically connected to the semiconductor elements 12A and the cooling block 26A. The spring members 20B are disposed between the semiconductor elements 12B and the metal blocks 14C, 14D and 14E. The spring members 20B are thermally, mechanically and electrically connected to the semiconductor elements 12B and the cooling block 26B.

The power module 10 has a configuration in which the semiconductor elements 12A and 12B are sandwiched by the metal blocks 14A and 14B and the cooling blocks 26A and 26B. In this configuration, the heat generated by the semiconductor elements 12A and 12B is conducted to the cooling blocks 26A and 26B that are disposed on both ends of the power module 10. Thus, it becomes possible to improve cooling performance of the power module 10 compared with a comparative power module which has one cooling block disposed only on one end of the comparative power module.

Cooling fins 28 are disposed on the outer surfaces of the cooling blocks 26A and 26B. The cooling fins 28 project outwardly from the outer surfaces of the cooling blocks 26A and 26B. Each of the cooling fins 28 is a type of a member which enhances heat exchange between the cooling block 26A or 26B and the cooling medium.

Insulating members 30 are inserted between the metal blocks 14A and 14B and the cooling blocks 26A and 26B, respectively. The insulating members 30 may be insulating sheets made of resin, for example. The insulating members 30 insulate the metal blocks 14A and 14B and the cooling blocks 26A and 26B, respectively. It is preferable that the insulating members 30 have higher thermal conductivity than molded resin 32 which will be described later. The power module 10 has a configuration in which the semiconductor elements 12A and 12B, the solders 18, 22 and 24, the metal blocks 14A to 14E, the spring members 20A and 20B and the insulating members 30 are stacked between the cooling blocks 26A and 26B.

The power module 10 includes the molded resin 32 which is supplied between the cooling blocks 26A and 26B. The molded resin 32 seals the semiconductor elements 12A and 12B, the solders 18, 22 and 24, the metal blocks 14A to 14E, the spring members 20 and the insulating members 30 between the cooling blocks 26A and 26B. The molded resin 32 is made of an epoxy resin, for example. The outer surfaces of the cooling blocks 26A and 26B are exposed from the molded resin 32. Accordingly, the molded resin 32 does not cover the outer surfaces of the cooling members 26A and 26B. When the power module 10 is manufactured, the semiconductor elements 12A and 12B, the solders 18, 22 and 24, the metal blocks 14A to 14E, the spring members 20, the insulating members 30 and the cooling blocks 26A and 26B are stacked and held in a molding die 34 which will be described later. And then the semiconductor elements 12A and 12B, the solders 18, 22 and 24, the metal blocks 14A to 14E, the spring members 20A and 20B, the insulating members 30 and the cooling blocks 26A and 26B are molded by resin which becomes the molded resin 32.

Figure 2:
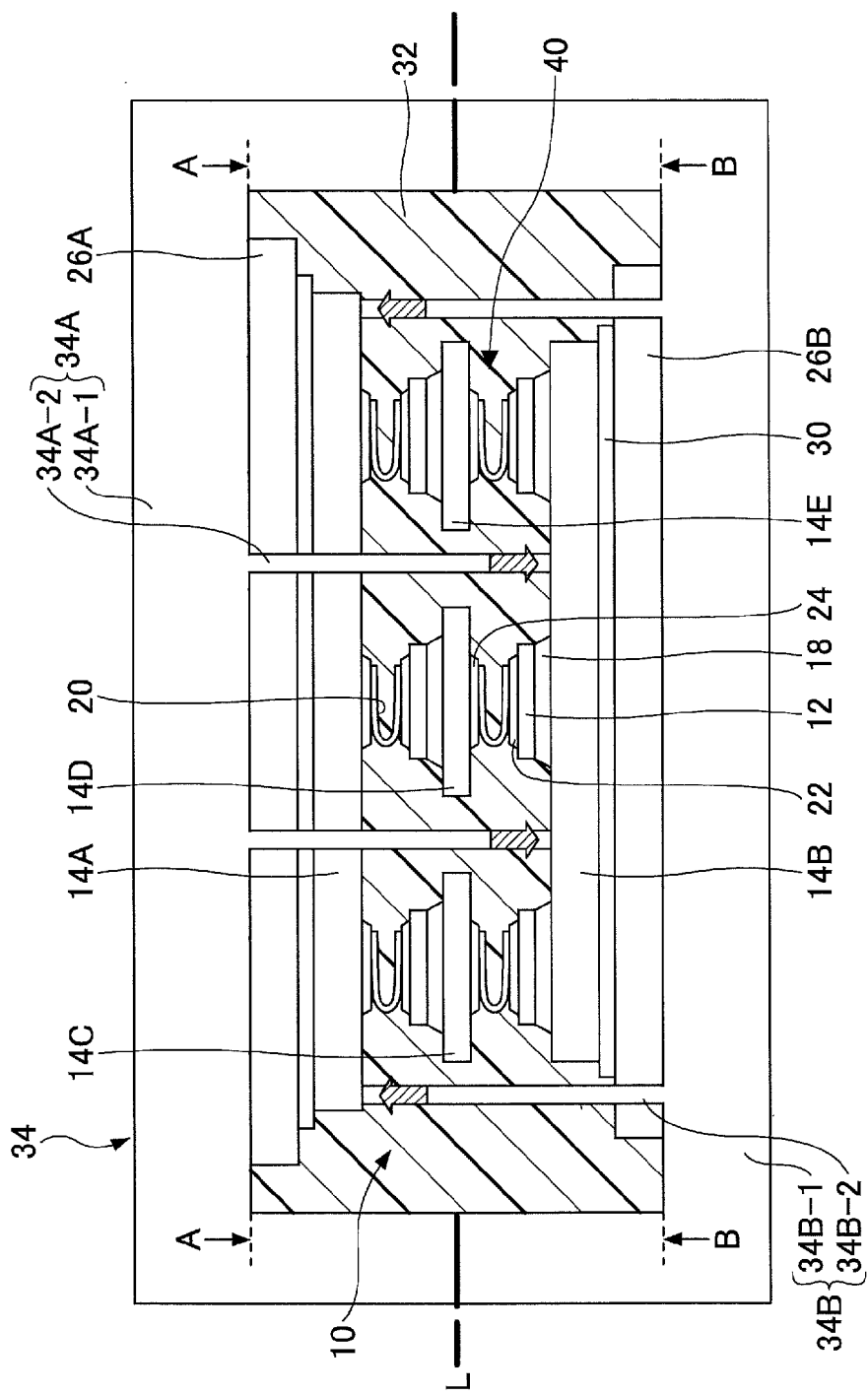
FIG. 2 is a cross-sectional view of the power module and a molding die of the first embodiment.

In the followings, the manufacturing process of the power module 10 of the present embodiment will be described with regard to FIGS. 2, 3A and 3B. FIG. 2 is a cross-sectional view of the power module 10 and the molding die 34 of the present embodiment. FIG. 3A is a cross-sectional view of the power module 10 and the molding die 34 taken along a line A-A illustrated in FIG. 2. FIG. 3B is a cross-sectional view of the power module 10 and the molding die 34 taken along a line B-B illustrated in FIG. 2.

In the present embodiment, the power module 10 is manufactured by using the molding die 34. The molding die 34 has inner dimensions that meet the outer shape of the power module 10 which becomes the final product. Before the molded resin 32 is formed, distance between the outer surfaces of the cooling blocks 26A and 26B (i.e., between the upper surface of the cooling block 26A and the lower surface of the cooling block 26B) sandwiching the semiconductor elements 12A and 12B, the solders 18, 22 and 24, the metal blocks 14A to 14E, the spring members 20 and the insulating members 30 is shorter than corresponding distance (an intended length) of the power module 10 after being molded by the molded resin 32. In other words, the distance between the outer surfaces of the cooling blocks 26A and 26B before being molded by the molded resin 32 is shorter than corresponding distance (the intended length) of the power module 10 when the power module 10 is completed as the final product. When the power module 10 is completed, the distance is equal to an inner dimension of the molding die 34. Before being molded by the molded resin 32, natural lengths of the spring members 20A and 20B in a stack direction are set to lengths that make the distance between the outer surfaces of the cooling members 26A and 26B shorter than corresponding distance of the power module 10 after being molded by the molded resin 32.

Hereinafter, a structural body in which the semiconductor elements 12A and 12B, the solders 18, 22 and 24, the metal blocks 14A to 14E, the spring members 20A and 20B and the insulating members 30 are sandwiched between the cooling blocks 26A and 26B before being molded by the molded resin 32 is referred to as a structural body 40.

The molding die 34 is separated into upper molding die 34A and lower molding die 34B. The upper molding die 34A and the lower molding die 34B are put together along a parting line L. The upper molding die 34A includes an upper body 34A-1 and upper pressing pins 34A-2. The upper body 34A-1 contacts the outer surface of the cooling block 26A and holds the cooling block 26A. The upper pressing pins 34A-2 extend from the inner surface of the upper body 34A-1 toward the cooling block 26B or the metal block 14B which is held by the lower molding die 34B. The lower molding die 34B includes a lower body 34B-1 and lower pressing pins 34B-2. The lower body 34B-1 contacts the outer surface of the cooling block 26B and holds the cooling block 26B. The lower pressing pins 34A-2 extend from the inner surface of the lower body 34B-1 toward the cooling block 26A or the metal block 14A which is held by the upper molding die 34A.

The upper pressing pins 34A-2 have lengths longer than length between the outer surface of the cooling block 26A and the upper surface of the metal block 14B of the structural body 40 in a state where the lengths of the spring members 20 are the natural lengths. More specifically, the upper pressing pins 34A-2 have the lengths that are almost the same as distance between the outer surface of the cooling block 26A and the upper surface of the metal block 14B of the power module 10 when the power module 10 is completed as the final product.

The lower pressing pins 34B-2 have lengths longer than length between the outer surface of the cooling block 26B and the lower surface of the metal block 14A of the structural body 40 in a state where the lengths of the spring members 20 are the natural lengths. More specifically, the lower pressing pins 34B-2 have the lengths that are almost the same as distance between the outer surface of the cooling block 26B and the lower surface of the metal block 14A of the power module 10 when the power module 10 is completed as the final product.

The pressing pins 34A-2 have function of pressing the metal block 14B disposed on the opposite side. The pressing pins 34B-2 have function of pressing the metal block 14A disposed on the opposite side. More specifically, the pressing pins 34A-2 and 34B-2 have functions of expanding the spring members 20 outwardly by pressing the metal blocks 14B and 14A, respectively.

As illustrated in FIGS. 3A and 3B, in the power module 10, each of the cooling blocks 26A and 26B has an opposed surface. The opposed surfaces of the cooling blocks 26A and 26B have almost the same areas and almost the same shapes and sizes. Each of the metal blocks 14A and 14B has an opposed surface. The opposed surfaces of the metal blocks 14A and 14B have different shapes and sizes with each other. For example, as illustrated in FIG. 3A, the metal block 14A has an elongated shape compared with the metal block 14B as illustrated in FIG. 3B. Length of the metal block 14A in the longitudinal direction in plan view is longer than that of the metal block 14B. Length of the metal block 14B in the direction vertical to the longitudinal direction in plan view is longer than that of the metal block 14A.

The opposed surfaces of the metal blocks 14A and 14B are smaller than the opposed surfaces of the cooling blocks 26A and 26B. The insulating members 30 are slightly larger than the metal blocks 14A and 14B in plan view. Accordingly, opposed surfaces of the insulating members 30 are larger than the opposed surfaces of the metal blocks 14A and 14B.

The cooling block 26A has through holes 36A. The upper pressing pins 34A-2 of the upper molding die 34A are inserted through the through holes 36A, respectively. The through holes 36A are formed in positions of the cooling block 26A that are located outside of an area opposing to the metal block 14A and are located in an area opposing to the metal block 14B, in plan view. The cooling block 26B has through holes 36B. The lower pressing pins 34B-2 of the lower molding die 34B are inserted through the through holes 36B, respectively. The through holes 36B are formed in positions of the cooling block 26B that are located outside of an area opposing to the metal block 14B and are located in an area opposing to the metal block 14A, in plan view.

The through holes 36A are located in positions where the through holes 36A do not overlap with the metal block 14A which is stacked with the cooling block 26A, but overlap with the metal block 14B which is stacked with the cooling block 26B. The through holes 36B are located in positions where the through holes 36B do not overlap with the metal block 14B which is stacked with the cooling block 26B, but overlap with the metal block 14A which is stacked with the cooling block 26A. The through holes 36A and 36B extend in the direction vertical to the surfaces of the cooling blocks 26A and 26B and the surfaces of the metal blocks 14A and 14B, i.e. in the vertical direction as illustrated in FIG. 1. The metal blocks 14A and 14B are designed to have sizes that meet the positions of the cooling blocks 26A and 26B and the through holes 36A and 36B.

In the manufacturing process of the power module 10, before the molded resin 32 is being molded, the three semiconductor elements 12A are soldered on the metal blocks 14C to 14E by the solders 18, respectively, and the other three semiconductor elements 12B are soldered on the metal block 14B by the solders 18. The three spring members 20A are soldered on the metal block 14A by the solders 24, respectively, and the other three spring members 20B are soldered on the metal blocks 14C to 14E by the solders 24, respectively. Then the semiconductor elements 12A and 12B and the spring members 20A and 20B are connected by the solders 22. Next, the insulating members 30 are temporarily fixed between the metal blocks 14A and 14B and the cooling blocks 26A and 26B, respectively. Thus, the structural body 40 in which the semiconductor elements 12A and 12B, the solders 18, 22 and 24, the metal blocks 14A to 14E, the spring members 20A and 20B and the insulating members 30 are sandwiched between the cooling blocks 26A and 26B is completed. Then the structural body 40 in which the semiconductor elements 12A and 12B, the solders 18, 22 and 24, the metal blocks 14A to 14E, the spring members 20A and 20B and the insulating members 30 are sandwiched between the cooling blocks 26A and 26B is inserted into the molding die 34 and held by the molding die 34.

As described above, in the structural body 40, the distance between the outer surfaces of the cooling blocks 26A and 26B in a state where the lengths of the spring members 20A and 20B are the natural lengths is shorter than the corresponding inner length of the molding die 34. The lengths of the upper pressing pins 34A-2 are longer than the distance between the outer surface of the cooling block 26A and the upper surface of the metal block 14B in a state where the lengths of the spring members 20A and 20B are the natural lengths in the structural body 40. And the lengths of the upper pressing pins 34A-2 are almost the same as the distance between the outer surface of the cooling block 26A and the upper surface of the metal block 14B when the power module 10 is completed as the final product. The lengths of the lower pressing pins 34B-2 are longer than the distance between the outer surface of the cooling block 26B and the lower surface of the metal block 14A in a state where the lengths of the spring members 20A and 20B are the natural lengths in the structural body 40. And the lengths of the lower pressing pins 34B-2 are almost the same as the distance between the outer surface of the cooling block 26B and the lower surface of the metal block 14A when the power module 10 is completed as the final product.

When the upper pressing pins 34A-2 of the upper molding die 34A are inserted into the through holes 36A of the cooling block 26A of the structural body 40 in a condition where the upper body 34A-1 of the upper molding die 34A contacts with the outer surface of the cooling block 26A of the structural body 40, the upper pressing pins 34A-2 contact with the upper surface of the metal block 14B. In this condition, the upper pressing pins 34A-2 press the upper surface of the metal block 14B downwardly, i.e. in the direction from the metal block 14B to the cooling block 26B which contacts with the metal block 14B via the insulating member 30.

When the lower pressing pins 34B-2 of the lower molding die 34B are inserted into the through holes 36B of the cooling block 26B of the structural body 40 in a condition where the lower body 34B-1 of the lower molding die 34B contacts with the outer surface of the cooling block 26B of the structural body 40, the lower pressing pins 34B-2 contact with the lower surface of the metal block 14A. In this condition, the lower pressing pins 34B-2 press the lower surface of the metal block 14A upwardly, i.e. in the direction from the metal block 14A to the cooling block 26A which contacts with the metal block 14A via the insulating member 30.

When the upper molding die 34A and the lower molding die 34B are put together along the parting line L, the upper pressing pins 34A-2 press the metal block 14B which is located in the lower side of the structural body 40 downwardly, and at the same time, the lower pressing pins 34B-2 press the metal block 14A which is located in the upper side of the structural body 40 upwardly.

The spring members 20A and 20B included in the frame members 16 of the structural body 40 can expand and contract in the vertical direction as illustrated in FIG. 1, i.e. the direction in which the metal blocks 14A and 14B face with each other. When the upper pressing pins 34A-2 press the metal block 14B and the lower pressing pins 34B-2 press the metal block 14A as the upper molding die 34A and the lower molding die 34B are put together along the parting line L, the spring members 20A and 20B are deformed and expanded in the vertical direction compared with the natural lengths in a condition where the cooling blocks 26A and 26B are held by the upper body 34A-1 of the upper molding die 34A and the lower body 34B-1 of the lower molding die 34B, respectively.

As the spring members 20A and 20B are deformed as described above, the distance between the outer surfaces of the cooling blocks 26A and 26B of the structural body 40 corresponds to the inner dimension of the molding die 34, i.e. the distance between the outer surfaces of the cooling blocks 26A and 26B of the structural body 40 becomes equal to a distance (the intended length) which is conclusively required between the outer surfaces of the cooling blocks 26A and 26B of the power module 10. In this condition, thickness of the structural body 40 becomes greater than that of the structural body 40 when the lengths of the spring members 20A and 20B are the natural lengths.

In a condition where the structural body 40 is held by the molding die 34 as described above, molding resin is injected into the molding die 34 at a designated molding pressure. The molding resin is a resin material which is used for forming the molded resin 32. By injecting the molding resin into the molding die 34, the molding resin is supplied between the cooling blocks 26A and 26B that are expanded by the upper pressing pins 34A-2 and 34B-2 via the metal blocks 14A and 14B, respectively. The molding resin becomes the molded resin 32 formed between the cooling blocks 26A and 26B. Accordingly, the power module 10 is completed. Finally, the upper pressing pins 34A-2 and the lower pressing pins 34B-2 of the molding die 34 are withdrawn from the through holes 36A and 36B of the cooling block 26A and 26B, respectively, and the power module 10 is picked up from the molding die 34.

Accordingly, it becomes possible to manufacture the power module 10 which has the intended length by supplying the molding resin into the molding die 34 in a state where the spring members 20A and 20B included in the structural body 40 between the cooling blocks 26A and 26B are expanded by the molding die 34. The spring members 20A and 20B are expanded in a state where the structural body 40 is inserted into the molding die 34 in the stack direction, i.e. the direction in which the metal blocks 14A and 14B face with each other (the vertical direction as illustrated in FIG. 1). The spring members 20A and 20B are included in the frame members 16.

According to the present embodiment, it is possible to absorb the dimensional tolerance of the power module 10 by utilizing the spring members 20A and 20B included in frame members 16 of the power module 10 and the molding die 34 including the upper pressing pins 34A-2 and the lower pressing pins 34B-2. Thus, it becomes possible to realize the dimensional management of the power module 10 in which the molded resin 32 is supplied between the cooling blocks 26A and 26B sandwiching the semiconductor elements 12A and 12B. Therefore, it becomes possible to suppress leakage of the molding resin from the molding die 34 and breakage of the semiconductor elements 12A and 12B or the like by the molding pressure during the molding process. Further, it is not necessary to inject extra molding resin into the molding die 32 during the molding process and to remove an excess portion of the molded resin 32 after adjusting the intended length.

In the present embodiment as described above, the upper pressing pins 34A-2 of the upper molding die 34A press the metal block 14B which is located lower side of the structural body 40 downwardly, and the lower pressing pins 34B-2 of the lower molding die 34B press the metal block 14A which is located upper side of the structural body 40 upwardly during the molding process. In other words, the upper pressing pins 34A-2 generate forces that press the metal block 14B downwardly, and the lower pressing pins 34B-2 generate forces that press the metal block 14A upwardly. In this condition, since the metal block 14B is pressed to a side of the cooling block 26B, the insulating member 30 disposed between the metal block 14B and the cooling block 26B is in close contact with and is sandwiched between the metal block 14B and the cooling block 26B. Since the metal block 14A is pressed to a side of the cooling block 26A, the insulating member 30 disposed between the metal block 14A and the cooling block 26A is in close contact with and is sandwiched between the metal block 14A and the cooling block 26A.

And then the molded resin 32 is formed between the cooling blocks 26A and 26B by injecting the molding resin therebetween in a state where the insulating members 30 are sandwiched between the metal blocks 14A and 14B and the cooling blocks 26A and 26B, respectively. According to the present embodiment, it is possible to fix the both surfaces of the insulating members 30 to the metal blocks 14A and 14B and the cooling blocks 26A and 26B, respectively by the molding pressure.

In the first embodiment as described above, the cooling block 26A is one example of a first cooling member, and the cooling block 26B is one example of a second cooling member. Herein, the first cooling member may include the cooling fins 28, the second cooling member may include the cooling fins 28. Each of the spring members 20A and 20B is one example of a spring member and an elastic member. The upper body 34A-1 is one example of a first molding body, and the lower body 34B-1 is one example of a second molding body. Each of the upper pressing pins 34A-2 is one example of a first pressing pin, and each of the lower pressing pins 34B-2 is one example of a second pressing pin. The molding die 34 is one example of a molding die used for manufacturing a power module.

Although the upper pressing pins 34A-2 and the lower pressing pins 34B-2 are connected to the upper body 34A-1 and the lower body 34B-1, respectively, and the upper pressing pins 34A-2 and the lower pressing pins 34B-2 extend toward the cooling blocks 26B and 26A (or the metal blocks 14B and 14A), respectively, the scope of the present invention is not limited to the configuration as described above.

Figure 4:
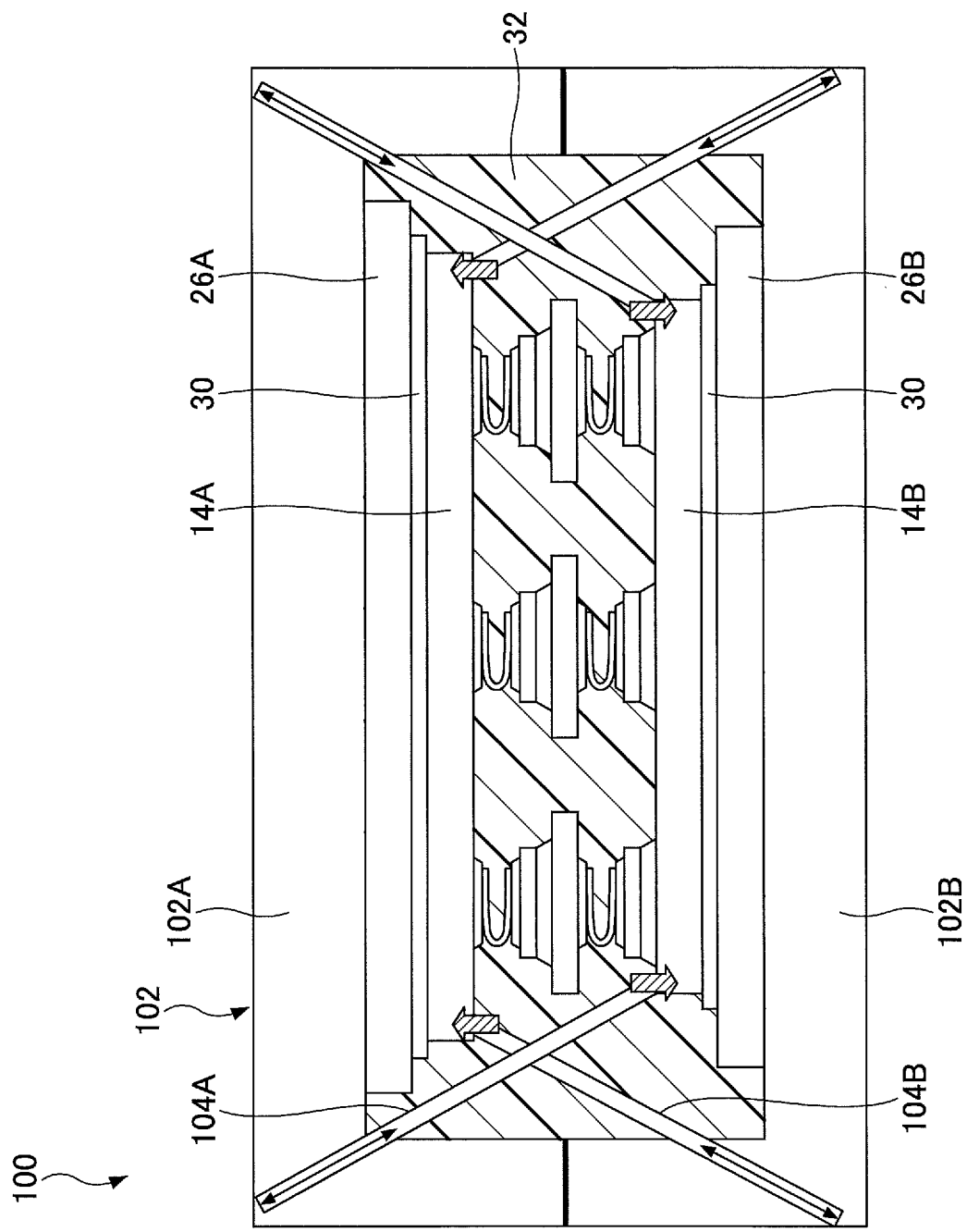
FIG. 4 is a cross-sectional view of a power module according to an exemplary variation of the first embodiment of the present invention.

As illustrated in FIG. 4, a molding die 102 may include an upper body 102A, a lower body 102B, upper pressing pins 104A and lower pressing pins 104B. The upper pressing pins 104A and the lower pressing pins 104B are separated from the upper body 102A and the lower body 102B, respectively. The upper pressing pins 104A extend toward the cooling block 26B (or the metal block 14B) from the upper body 102A, and the lower pressing pins 104B extend toward the cooling block 26A (or the metal block 14A) from the lower body 102B. The upper pressing pins 104A press the metal block 14B downwardly, and the lower pressing pins 104B press the metal block 14A upwardly during the molding process of a power module 100. In this exemplary variation, the upper pressing pins 104A and the lower pressing pins 104B may be expanded or contracted by a displace machine between positions for pressing the metal blocks 14A and 14B, respectively, and positions for releasing the metal blocks 14A and 14B.

In this exemplary variation, since the upper pressing pins 104A and the lower pressing pins 104B are separated from the upper body 102A and the lower body 102B, respectively, the upper pressing pins 104A and the lower pressing pins 104 can be withdrawn before removing the upper body 102A and the lower body 102B from the power module 100 when the power module 100 is completed. Therefore, according to the exemplary variation as described above, it becomes possible to suppress breakage of the molded resin 32 that may be caused when the upper pressing pins 104A and the lower pressing pins 104B are withdrawn from the upper body 102A and the lower body 102B, respectively. This is different from the embodiment in that the molding die 34 having the upper pressing pins 34A-2 and the lower pressing pins 34B-2 that are unified with the upper body 34A-1 and the lower body 34B-1, respectively, is removed from the power module 10.

In this exemplary variation, it is not necessary for forming through holes for inserting the upper pressing pins 104A and the lower pressing pins 104B therethrough in the cooling blocks 26A and 26B. The upper pressing pins 104A and the lower pressing pins 104B may be inserted into the through holes that are formed obliquely on the side walls of the molding die 34. The upper pressing pins 104A and the lower pressing pins 104B can be expanded or contracted through the through holes formed obliquely on the side walls of the molding die 34 by the displace machine. In this configuration, the upper pressing pins 104A and the lower pressing pins 104B contact with the upper surface of the metal block 14B and the lower surface of the metal block 14A obliquely, respectively. Although holes that are formed by insertion of the upper pressing pins 104A and the lower pressing pins 104B remain on the side walls of the molded resin 32 of the power module 100, insulating performance and cooling performance of the power module 100 are not affected by the holes formed on the side walls of the molded resin 32. Thus, it is not necessary to cover the holes after completion of the power module 100.

According to the embodiment as illustrated in FIGS. 1 to 3, the upper pressing pins 34A-2 and the lower pressing pins 34B-2 extend vertical to the upper surface of the metal block 14B and the lower surface of the metal block 14A, respectively. Thus, the sizes of the metal blocks 14A and 14B are different from each other. On the contrary, the exemplary variation as described above is different from the embodiment as described with regard to FIGS. 1 to 3 in that the upper pressing pins 104A and the lower pressing pins 104B extend obliquely toward the upper surface of the metal block 14B and the lower surface of the metal block 14A. Thus, according to the exemplary variation as illustrated in FIG. 4, it becomes possible to commonalize the sizes of the metal blocks 14A and 14B. Further, it becomes possible to enhance use of space in the power module 100 and to suppress increase of manufacturing steps.

As described above, before the power module 10 is completed, the natural lengths of the spring members 20A and 20B in the stack direction are set to lengths that make the distance between the outer surfaces of the cooling members 26A and 26B shorter than corresponding distance of the power module 10 when the power module 10 is completed as the final product. The distance between the outer surfaces of the cooling blocks 26A and 26B is expanded to the designated distance (the intended length) in the stack direction and kept to the designated distance by the molding die 34 during the manufacturing process. The present invention is not limited to the embodiment as described above.

Figure 5:
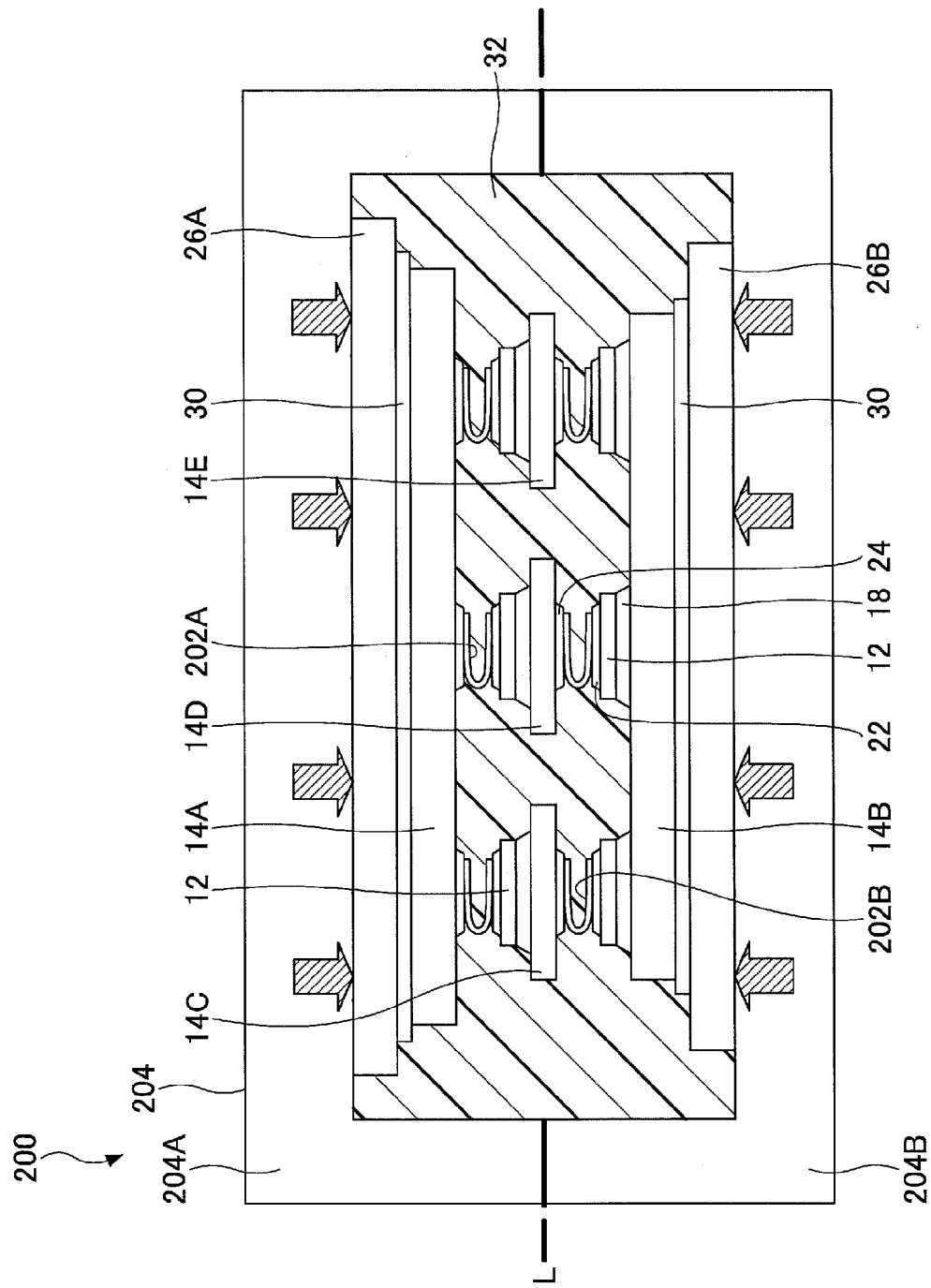
FIG. 5 is a cross-sectional view of a power module according to another exemplary variation of the first embodiment of the present invention.

As illustrated in FIG. 5, before a power module 200 is completed, natural lengths of spring members 202A and 202B in the stack direction are set to lengths that make the distance between the outer surfaces of the cooling members 26A and 26B longer than corresponding distance of the power module 200 when the power module 200 is completed as the final product. The distance between the outer surfaces of the cooling blocks 26A and 26B is contracted to the designated distance (the intended length) by being pressed by the molding die 204.

In the exemplary variation as illustrated in FIG. 5, it becomes possible to manufacture the power module 200 which has the intended length by supplying the molding resin into the molding die 204 in a state where the spring members 202A 202B disposed between the cooling blocks 26A and 26B are contracted by being pressed in the molding die 204. The spring members 202A and 202B are contracted in a state where the spring members 202A and 202B are being inserted into the molding die 204.

Thus, similar advantageous effects to those of the embodiments as illustrated in FIGS. 1 to 3 can be obtained according to the exemplary variation as illustrated in FIG. 5. When an upper molding die 204A and a lower molding die 204B of the molding die 204 are put together along a parting line L during the molding process of the power module 200, the insulating members 30 are in close contact with and are sandwiched between the metal blocks 14A and 14B and the cooling blocks 26A and 26B, respectively, by pressing forces generated in the molding die 204. Thus, it is possible to fix the surfaces of the insulating members 30 to the metal blocks 14A and 14B and the cooling blocks 26A and 26B, respectively. In the exemplary variation as illustrated in FIG. 5, it is not necessary to dispose pressing pins such as the upper pressing pins 34A-2 and the lower pressing pins 34B-2 in the molding die 204. Thus, no holes remain in the molded resin 32 and the cooling blocks 26A and 26B of the power module 200.

Figure 6:
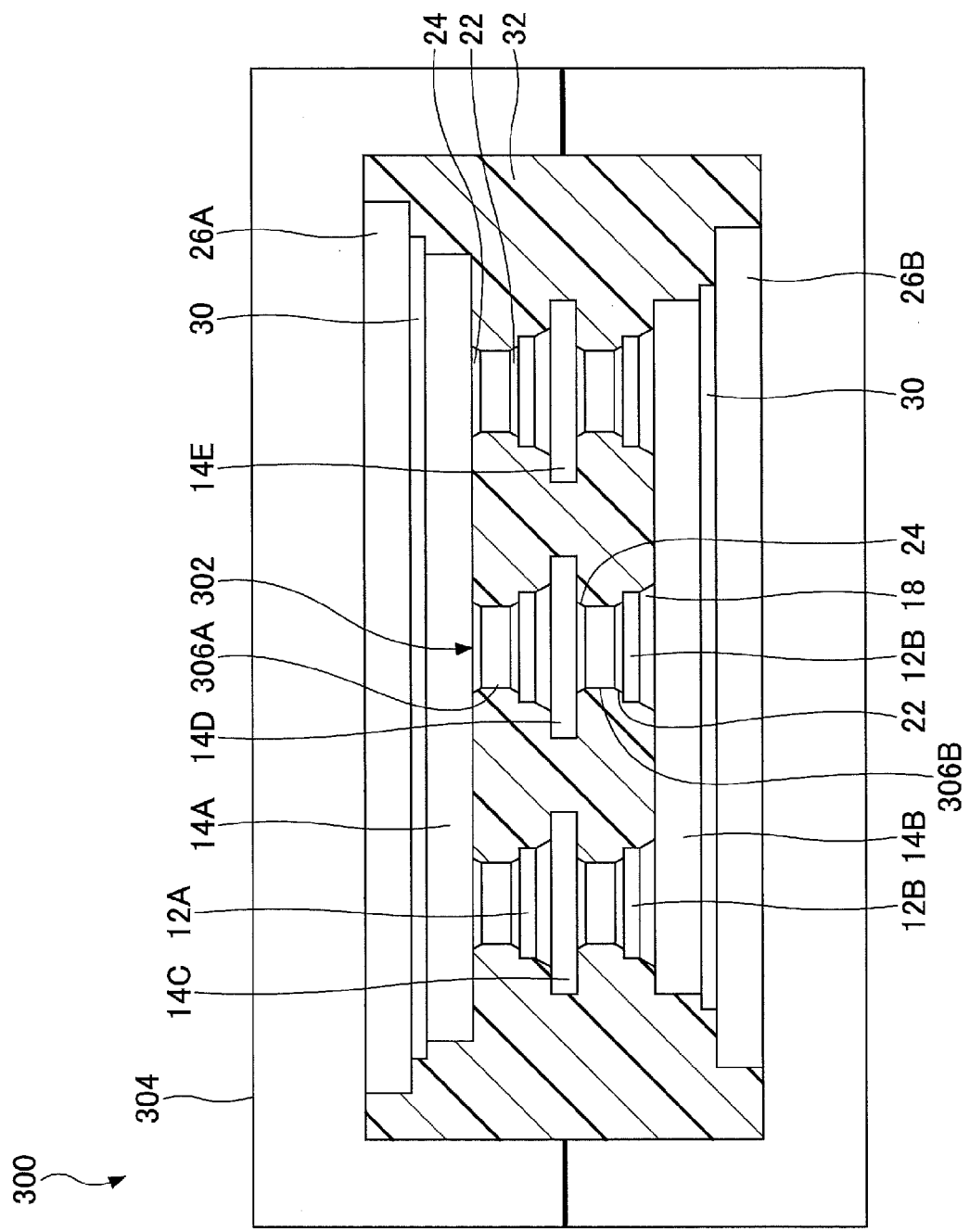
FIG. 6 is a cross-sectional view of a power module according to another exemplary variation of the first embodiment of the present invention.

As described in the first embodiment, the spring members 20A and 20B that can expand and contract in the stack direction between the metal blocks 14A and 14B are disposed as a part of the respective frame members 16 that are disposed between the cooling blocks 26A and 26B. However, the present embodiment is not limited to the embodiment as described above. Conductive resins 306A and 306B may be used instead of the spring members 20A and 20B as illustrated in FIG. 6. In this case, the conductive resins 306A and 306B having high heat transfer performance are included in frame members 302 disposed between the cooling blocks 26A and 26B. The conductive resins 306A and 306B can be expanded and contracted in the stack direction of the semiconductor elements 12A and 12B and the cooling blocks 26A and 26B by being pressed or pulled in a molding die 304 during the molding process of a power module 300.

The conductive resins 306A are disposed between the semiconductor elements 12A and the metal block 14A. The conductive resins 306B are disposed between the semiconductor elements 12B and the metal blocks 14C, 14D and 14E. The conductive resins 306A are disposed between the semiconductor elements 12A and the metal blocks 14A (i.e., between the semiconductor elements 12A and the cooling block 26A). The conductive resins 306B are disposed between the semiconductor elements 12B and the metal blocks 14C, 14D and 14E. For example, the conductive resins 306A and 306B are made of epoxy resin including conductive fillers or conductive polymers. The conductive resins 306A and 306B are formed in block shapes. The conductive resins 306A and 306B have elasticity and can expand and contract in the stack direction. The conductive resins 306A and 306B have higher heat transfer performance than the spring members 20A and 20B as described above.

Lower ends of the conductive resins 306A are connected to the semiconductor elements 12A via the solders 22. Lower ends of the conductive resins 306B are connected to the semiconductor elements 12B via the solders 22. Upper ends of the conductive resins 306A are connected to the metal block 14A via the solders 24. Upper ends of the conductive resins 306B are connected to the metal blocks 14C, 14D and 14E via the solders 24, respectively. Distances between the semiconductor elements 12A and 12B and the metal blocks 14A, 14B, 14C, 14D and 14E can be adjusted by the conductive resins 306A and 306B. Distances between the metal block 14A and the metal blocks 14C, 14D and 14E can be adjusted by expansion or contraction of the conductive resins 306A. Distances between the metal block 14B and the metal blocks 14C, 14D and 14E can be adjusted by expansion or contraction of the conductive resins 306B.

Before being molded by the molded resin 32, natural lengths of the conductive resins 306A and 306B in the stack direction are set to lengths that make the distance between the outer surfaces of the cooling members 26A and 26B longer than corresponding distance of the power module 300 after being molded by the molded resin 32.

In the exemplary variation as illustrated in FIG. 6, it becomes possible to manufacture the power module 300 which has the intended length by supplying the molding resin into the molding die 304 in a state where the conductive resins 306A and 306B disposed between the cooling blocks 26A and 26B are contracted by being pressed in the molding die 304. The conductive resins 306A and 306B are contracted in a state where the conductive resins 306A and 306B are inserted into the molding die 304. The intended length is equal to an inner dimension of the molding die 34. Thus, similar advantageous effects to those of the embodiments as illustrated in FIGS. 1 to 5 can be obtained according to the exemplary variation as illustrated in FIG. 6. According to the exemplary variation as illustrated in FIG. 6, as described above, the conductive resins 306A and 306B have higher heat transfer performance than the spring members 20A and 20B. Accordingly, it becomes possible to improve the heat transfer performance between the semiconductor elements 12A and cooling block 26A and between the semiconductor elements 12B and the cooling block 26B.

In this exemplary variation as illustrated in FIG. 6, before being molded by the molded resin 32, the natural lengths of the conductive resins 306A and 306B in the stack direction are set to lengths that make the distance between the outer surfaces of the cooling members 26A and 26B longer than the corresponding distance of the power module 300 after being molded by the molded resin 32. The natural lengths of the conductive resins 306A and 306B in the stack direction, before being molded by the molded resin 32, are set to lengths that make the distance between the outer surfaces of the cooling members 26A and 26B shorter than the corresponding distance of the power module 300 after being molded by the molded resin 32. Accordingly, in the exemplary variation as illustrated in FIG. 6, the distance between the outer surfaces of the cooling members 26A and 26B are adjusted to the intended length by causing the molding die 304 to pull or press the conductive resins 306A and 306B in the stack direction when the power module 300 is being molded.

Second Embodiment

Figure 7:
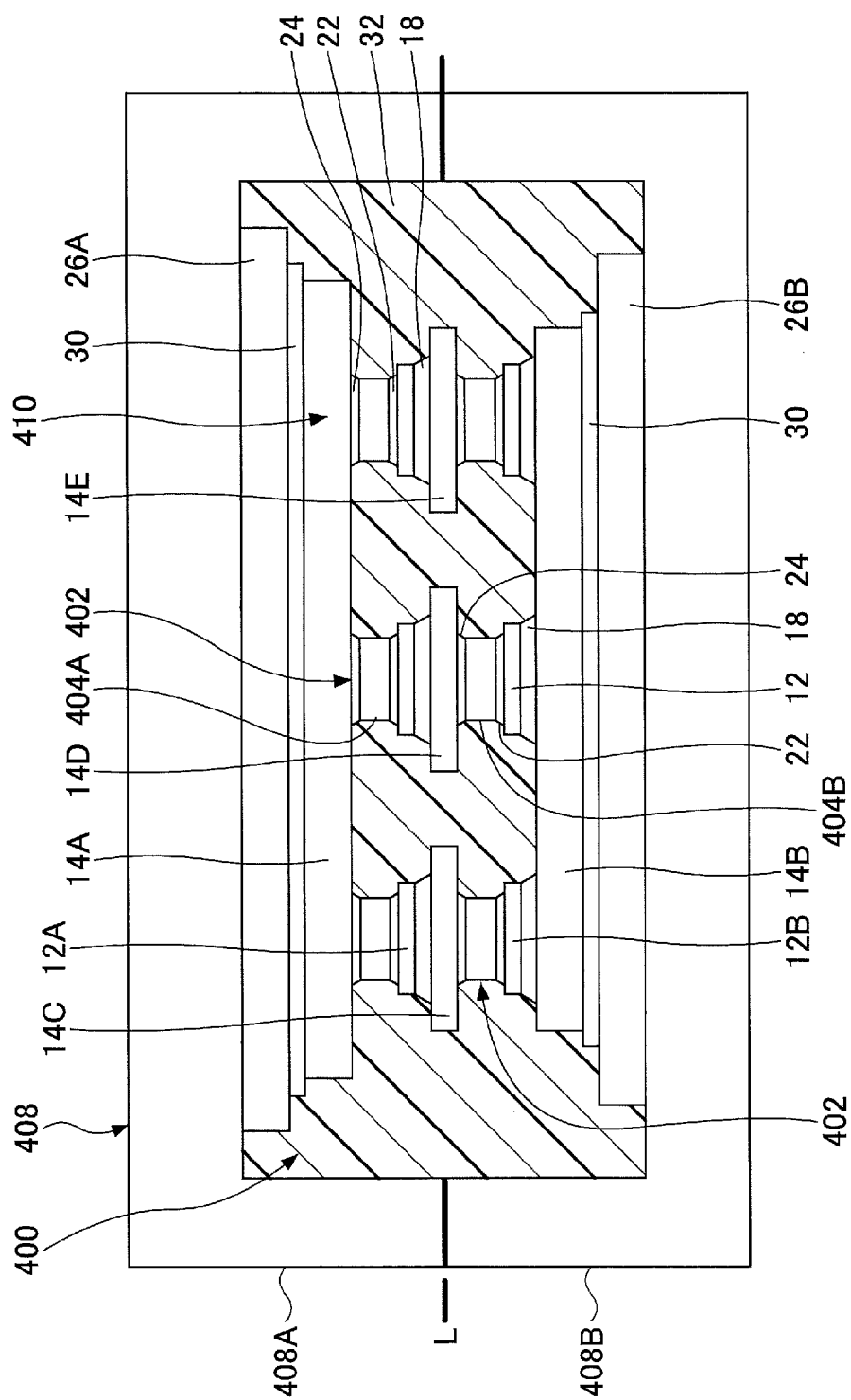
FIG. 7 is a cross-sectional view of a power module inserted between a molding die according to a second embodiment of the present invention.
Figure 8:
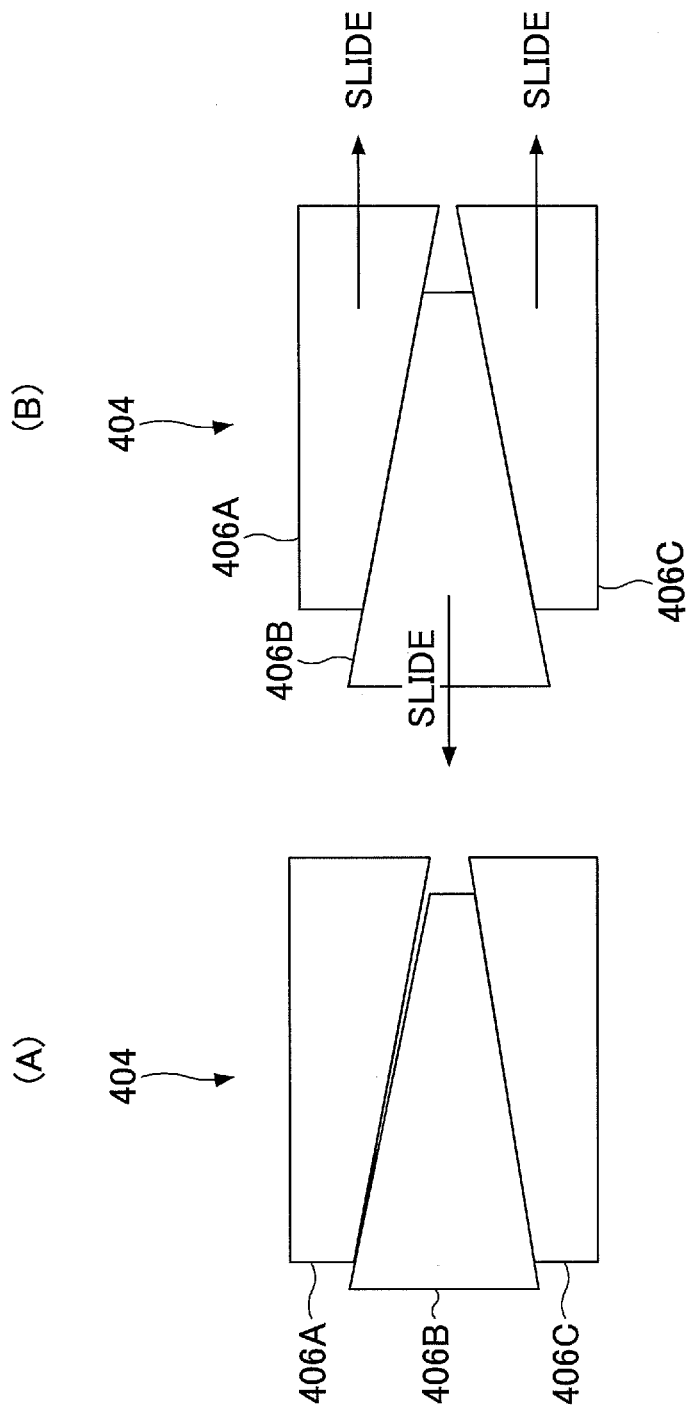
FIG. 8 illustrates a block member included in a frame member of the power module 400 of the second embodiment.

FIG. 7 is a cross-sectional view of a power module 400 inserted between parts of a molding die 408 according to a second embodiment of the present invention. In FIG. 7, the same elements as or elements similar to those of the power modules 10, 100, 200 and 300 as illustrated in FIGS. 1 to 6 are referred to by the same reference numerals, and a description thereof is omitted or simplified. FIG. 8 illustrates block members 404 included in a frame member 402 of the power module 400 of the second embodiment. As illustrated in FIG. 7, the power module 400 includes block members 404A and 404B. The block members 404A and 404B have the same configuration as that of the block member 404 as illustrated in FIG. 8. Accordingly, the block members 404A and 404B may be referred to as the block member 404 in a case where the block members 404A and 404B are not distinguished. FIG. part 8 (A) illustrates the block member 404 in a state before causing the molding die 304 to press the block member 404 in the stack direction in order to mold the power module 400. FIG. part 8 (B) illustrates the block member 404 in a state after causing the molding die 304 to press the block member 404 in the stack direction in order to mold the power module 400.

In the power module 400, the upper three frame members 402 support the semiconductor elements 12A between the metal block 14A and the metal blocks 14C, 14D and 14E. The lower three frame members 402 support the semiconductor elements 12B between the metal block 14B and the metal blocks 14C, 14D and 14E. The lower surfaces of the semiconductor elements 12A are connected to the upper surfaces of the metal blocks 14C, 14D and 14E via the solders 18. The upper surfaces of the semiconductor elements 12A are connected to the lower surface of the metal block 14A via the frame members 402 including the block members 404A. The lower surfaces of the semiconductor elements 12B are connected to the upper surfaces of the metal block 14B via the solders 18. The upper surfaces of the semiconductor elements 12B are connected to the lower surface of the metal blocks 14C, 14D and 14E via the frame members 402 including the block members 404B.

The three block members 404A constitute parts of the corresponding three upper frame members 402. The three block members 404B constitute parts of the corresponding three lower frame members 402. The upper three frame members 402 include the block members 404A between the metal block 14A and the metal blocks 14C, 14D and 14E, i.e. between the cooling block 26A and the metal blocks 14C, 14D and 14E. The lower three frame members 402 include the block members 404B between the metal blocks 14C, 14D and 14E and the metal block 14B, i.e. between the metal blocks 14C, 14D and 14E and the cooling block 26B. The block members 404A and 404B can adjust their respective heights. The block members 404A and 404B are connected in series between the metal blocks 14A and 14B. The block members 404A and 404B are made of a metallic material having a heat transfer performance and conductivity such as copper or the like, for example. Heat capacities of the block members 404A and 404B are greater than those of the spring members 20A and 20B of the first embodiment.

Each of the block members 404A and 404B includes a multilayered block configuration in which block pieces 406A, 406B and 406C are stacked in the stack direction. The block pieces 406A, 406B and 406C are relatively slidable to each other in a direction orthogonal to the stack direction. Although the three block pieces 406A, 406B and 406C are illustrated in FIG. 8, the number of the block pieces is not limited to three. The multilayered block configuration may include two or more slidable pieces. Thicknesses of the block pieces 406A, 406B and 406C vary in the direction orthogonal to the stack direction, i.e. the width direction of the block pieces 406A, 406B and 406C. Herein, the thicknesses of the block pieces 406A, 406B and 406C correspond to lengths of the block pieces 406A, 406B and 406C in the stack direction. The thicknesses of the block pieces 406A and 406C increase from the left side to the right side as illustrated in FIG. 8. The thickness of the block piece 406B increases from the left side to the right side as illustrated in FIG. 8. The block piece 406A has an inclined lower surface which contacts with an inclined upper surface of the block piece 406B. The block piece 406B has the inclined upper surface which contacts with the inclined lower surface of the block piece 406A and an inclined lower surface which contacts with an inclined upper surface of the block piece 406C. The inclined lower surface of the block piece 406A, the inclined upper and lower surfaces of the block piece 406B, and the inclined upper surface of the block piece 406C are inclined with regard to the width direction.

The block pieces 406A, 406B and 406C have shapes that are obtained by slicing a cylindrical metal solid having a flat upper surface and a flat lower surface into three pieces along two inclined surfaces that are inclined with regard to the central axis of the cylindrical metal solid. The perpendicular line of the upper surface of the block piece 406A extends in the stack direction. The upper surface of the block piece 406A of the block member 404 is connected to any one of the metal block 14A, 14C, 14D or 14E via the solder 24. The perpendicular line of the lower surface of the block piece 406C extends in the stack direction. The lower surface of the slidable block 406C of the block member 404 is connected to any one of the semiconductor elements 12A or 12B via the solder 22. The perpendicular line of the lower surface of the block piece 406A extends in an inclined direction with regard to the stack direction. The perpendicular line of the upper surface of the block piece 406C extends in an inclined direction with regard to the stack direction.

The perpendicular line of the upper surface of the block piece 406B extends in an inclined direction with regard to the stack direction. The upper surface of the slidable piece 406B contacts with the lower surface of the block piece 406A. The perpendicular line of the lower surface of the block piece 406B extends in an inclined direction with regard to the stack direction. The lower surface of the slidable piece 406A contacts with the upper surface of the block piece 406C. The perpendicular line of the upper surface of the block piece 406B is not parallel to the perpendicular line of the lower surface of the block piece 406B. The perpendicular line of the lower surface of the block piece 406A is not parallel to the perpendicular line of the upper surface of the block piece 406C. The perpendicular line of the lower surface of the block piece 406A is almost parallel to the perpendicular line of the upper surface of the block piece 406B. The perpendicular line of the lower surface of the block piece 406B is almost parallel to the perpendicular line of the upper surface of the block piece 406C.

The block piece 406B is slidable in the width direction with regard to the block pieces 406A and 406C. The block pieces 406A and 406C are relatively slidable with regard to the block piece 406B as illustrated in FIG. part 8 (B). As illustrated in FIG. 8, the block pieces 406A and 406C are relatively slidable in the width direction with regard to the block piece 406B. The block piece 406B is slidable in the width direction with regard to the block pieces 406A and 406C. The block pieces 406A, 406B and 406C relatively slide with each other in the width direction in a state where the block pieces 406A, 406B and 406C are pressed in the stack direction. As the block piece 406B slides in the width direction with regard to the block pieces 406A and 406C when the block pieces 406A, 406B and 406C are being pressed in the stack direction, the height of the block member 404A varies. The same applies to the block member 404B.

Lower ends of the block members 404A are connected to the semiconductor elements 12A via the solders 22. Lower ends of the block members 404B are connected to the semiconductor elements 12B via the solders 22. Upper ends of the block members 404A are connected to the metal block 14A via the solders 24. Upper ends of the block members 404B are connected to the metal blocks 14C, 14D and 14E via the solders 24, respectively. Distances between the semiconductor elements 12A and 12B and the metal blocks 14A, 14B, 14C, 14D and 14E can be adjusted by the block members 404A and 404B. Distances between the metal block 14A and the metal blocks 14C, 14D and 14E can be adjusted by exemplary variations of the height of the block members 404A. Distances between the metal block 14B and the metal blocks 14C, 14D and 14E can be adjusted by exemplary variations of the height of the block members 404B.

The block members 404A are disposed between the semiconductor elements 12A and the cooling block 26A. The block members 404A are thermally, mechanically and electrically connected to the semiconductor elements 12A and the cooling block 26A. The block members 404B are disposed between the semiconductor elements 12B and the metal blocks 14C, 14D and 14E.

In the present embodiment, the power module 400 is manufactured by using the molding die 408. The molding die 408 has inner dimensions that meet the outer shape of the power module 400 which becomes the final product. Before the molded resin 32 is formed, a distance between the outer surfaces of the cooling blocks 26A and 26B sandwiching the semiconductor elements 12A and 12B, the solders 18, 22 and 24, the metal blocks 14A to 14E, the block members 404 and the insulating members 30 is longer than a corresponding distance (the intended length) of the power module 400 after being molded by the molded resin 32. In other words, the distance between the outer surfaces of the cooling blocks 26A and 26B before being molded by the molded resin 32 is longer than corresponding distance (the intended length) of the power module 400 when the power module 400 is completed as the final product. When the power module 400 is completed, the distance is equal to an inner dimension of the molding die 408.

Before being molded by the molded resin 32, natural lengths of the block members 404A and 404B in a stack direction are set to lengths that make the distance between the outer surfaces of the cooling members 26A and 26B longer than corresponding distance of the power module 400 after being molded by the molded resin 32. Accordingly, the heights (i.e. the lengths in the stack direction) of the block members 404A and 404B are relatively high. Hereinafter, a structural body in which the semiconductor elements 12A and 12B, the solders 18, 22 and 24, the metal blocks 14A to 14E, the block members 404A and 404B and the insulating members 30 are sandwiched between the cooling blocks 26A and 26B before being molded by the molded resin 32 is referred to as a structural body 410.

The molding die 408 is separated into upper molding die 408A and lower molding die 408B. The upper molding die 408A and the lower molding die 408B are put together along a parting line L. The upper molding die 408A contacts the outer surface of the cooling block 26A and supports the cooling block 26A. The lower molding die 408B contacts the outer surface of the cooling block 26B and supports the cooling block 26B.

In the manufacturing process of the power module 400, before the molded resin 32 is molded, the three semiconductor elements 12A are soldered on the metal blocks 14C to 14E by the solders 18, respectively, and the other three semiconductor elements 12B are soldered on the metal block 14B by the solders 18. The three block members 404A are soldered on the metal block 14A by the solders 24, respectively, and the other three block members 404B are soldered on the metal blocks 14C to 14E by the solders 24, respectively. Then the semiconductor elements 12A and 12B and the block members 404A and 404B are connected by the solders 22. Next, the insulating members 30 are temporarily fixed between the metal blocks 14A and 14B and the cooling blocks 26A and 26B, respectively. Thus, a structural body 410 in which the semiconductor elements 12A and 12B, the solders 18, 22 and 24, the metal blocks 14A to 14E, the block members 404A and 404B and the insulating members 30 are sandwiched between the cooling blocks 26A and 26B is completed. Then the structural body 410 in which the semiconductor elements 12A and 12B, the solders 18, 22 and 24, the metal blocks 14A to 14E, the block members 404A and 404B and the insulating members 30 are sandwiched between the cooling blocks 26A and 26B is inserted into the molding die 408 and held by the molding die 408.

When the structural body 410 is inserted into the molding die 408, an upper end portion and a lower end portion of the structural body 410 contact with the inner surfaces of the upper molding die 408A and the lower molding die 408B, respectively, and are pressed in the stack direction by the molding die 408. As described above, the distances between the semiconductor elements 12A and the metal block 14A can be adjusted by the exemplary variations of the height of the block members 404A. Similarly, the distances between the semiconductor elements 12B and the metal blocks 14C, 14D and 14E can be adjusted by the exemplary variations of the height of the block members 404B. When the upper molding die 408A and the lower molding die 408B are put together along the parting line L, and the structural body 410 is pressed in the stack direction, the slidable block members 406A, 406B and 406C relatively slide with each other. Accordingly, the heights of the block members 404 become lower.

As the heights of the block members 404 become lower as described above, the distance between the outer surfaces of the cooling blocks 26A and 26B of the structural body 410 corresponds to the inner dimension of the molding die 408, i.e. the distance between the outer surfaces of the cooling blocks 26A and 26B of the structural body 410 becomes equal to the inner dimension (the intended length) of the molding die 408 which is conclusively required between the outer surfaces of the cooling blocks 26A and 26B of the power module 400.

In a condition where the structural body 410 is held by the molding die 408 as described above, molding resin is injected into the molding die 408 at a designated molding pressure. By injecting the molding resin into the molding die 408, the molding resin is supplied between the cooling blocks 26A and 26B that are pressed by the upper molding die 408A and the lower molding die 408B. The molding resin becomes the molded resin 32 formed between the cooling blocks 26A and 26B. Accordingly, the power module 400 is completed. Then the power module 400 is picked up from the molding die 408.

Accordingly, it becomes possible to manufacture the power module 400 which has the intended length by supplying the molding resin into the molding die 34 in a state where the block members 404A and 404B included in the structural body 410 between the cooling blocks 26A and 26B are pressed by the molding die 408. The block pieces 406A to 406C relatively slide with each other, and the block members 404A and 404B are contracted in a state where the structural body 40 is inserted into the molding die 408 in the stack direction. The block members 404A and 404B are included in the frame members 402.

According to the present embodiment, it is possible to absorb the dimensional tolerance of the power module 400 by utilizing the block members 404A and 404B included in frame members 402 of the power module 400. Thus, it becomes possible to realize the dimensional management of the power module 400 in which the molded resin 32 is supplied between the cooling blocks 26A and 26B sandwiching the semiconductor elements 12A and 12B. Therefore, it becomes possible to suppress leakage of the molding resin from the molding die 408 and breakage of the semiconductor elements 12A and 12B or the like by the molding pressure during the molding process. Further, it is not necessary to inject extra molding resin into the molding die 32 during the molding process and to remove an excess portion of the molded resin 32 after adjusting the intended length.

According to the second embodiment, the frame members 402 include block members 404A and 404B having the block pieces 406A to 406C in order to adjust the distance between the outer surfaces of the cooling blocks 26A and 26B to the intended length which is conclusively required between the outer surfaces of the cooling blocks 26A and 26B of the power module 400. As described above, the heat capacities of the block members 404A and 404B are greater than that of the spring members 20A and 20B of the first embodiment. Therefore, it becomes possible to improve the heat transfer performance between the semiconductor elements 12A and 12B and the cooling blocks 26A and 26B.

In the second embodiment as described above, the block member 404 is one example of a block member, and each of the block pieces 406A, 406B and 406C is one example of a block piece.

Before the power module 400 is completed, the natural lengths of block members 404A and 404B in the stack direction are set to lengths that make the distance between the outer surfaces of the cooling members 26A and 26B longer than corresponding distance of the power module 400 when the power module 400 is completed as the final product. The distance between the outer surfaces of the cooling blocks 26A and 26B is contracted to the designated distance (the intended length) by being pressed by the molding die 408. In this case, the block members 404A and 404B are contracted in the stack direction. The second embodiment is not limited to the configuration as described above. On the contrary, before the power module 400 is completed, the natural lengths of block members 404A and 404B in the stack direction may be set to lengths that make the distance between the outer surfaces of the cooling members 26A and 26B shorter than corresponding distance of the power module 400 when the power module 400 is completed as the final product. The distance between the outer surfaces of the cooling blocks 26A and 26B is expanded to the designated distance (the intended length) by being pulled by the molding die 408. In this case, the block members 404A and 404B are expanded in the stack direction.

In the second embodiment, the block pieces 406A to 406C can relatively slide with each other in the width direction. Herein, the block pieces 406A and 406C may be connected to the metal blocks 14A to 14E. In this case, the block piece 406B can slide with regard to the block pieces 406A and 406C and the metal blocks 14A to 14E. On the contrary, the block piece 406B may be fixed to the metal blocks 14A to 14E, and the block pieces 406A and 406C may be slidably connected to the block piece 406B and the metal blocks 14A to 14E.

According to the first and second embodiments as described above, the spring members 20A and 20B are included in the frame members 16, and the block members 404A and 404B are included in the frame members 402. Further, the spring members 20A and 20B and the block members 404A and 404B are disposed in isolation from the metal blocks 14A. The present embodiments are not limited to the configurations as described above. The spring members 20A and 20B and the block members 404A and 404B are formed with the metal blocks 14A to 14E in a unified manner. In this case, the metal blocks 14A to 14E may have configurations in that the metal blocks 14A to 14E can expand or contract in the stack direction.

In the first and second embodiments as described above, the power modules 10 and 400 have multistage structures in which the semiconductor elements 12A and 12B are connected in series between the metal blocks 14A and 14B, i.e. between the cooling blocks 26A and 26B. The multistage structures include frame members 16 and 402 having the spring members 20A and 20B and the block members 404A and 404B, respectively. In the multistage structure, the three spring members 20A are provided for the three semiconductor elements 12A, respectively, and the three spring members 20B are provided for the three semiconductor elements 12B, respectively. Further, in the multistage structure, the spring members 20A and 20B or the block members 404A and 404B are connected in series between the metal blocks 14A and 14B.

However, the present embodiments are not limited to the configurations as described above. In the multistage structure, at least one spring member 20 or one block member 404 may be disposed between the cooling blocks 26A and 26B in the stack direction, i.e. between the metal blocks 14A and 14B in the stack direction. Accordingly, in a case where the semiconductor elements 12A and 12B are connected in series between the metal blocks 14A and 14B, it is not always necessary to provide two or more spring members 20 connected in series between the metal blocks 14A and 14B, or to provide two or more block members 404 connected in series between the metal blocks 14A and 14B. In this case, one spring member or one block member 404 may be provided between the metal blocks 14A and 14B. Here, one spring member 20 or one block member 404 may be connected in series with each pair of the two semiconductor elements 12A and 12B between the metal blocks 14A and 14B.

Figure 9:
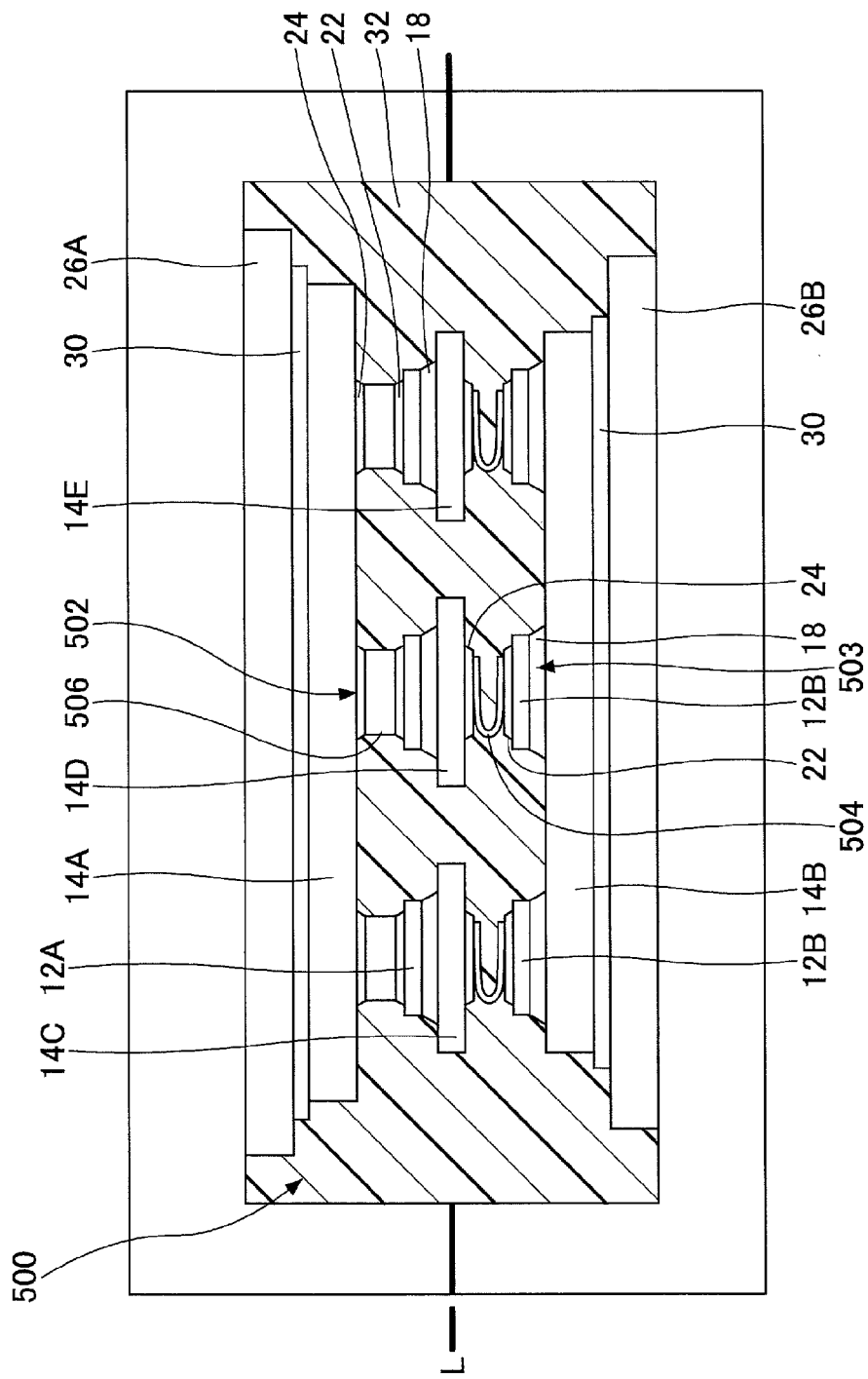
FIG. 9 is a cross-sectional view of a power module according to an exemplary variation of the second embodiment of the present invention.

For example, in a power module 500 as illustrated in FIG. 9, the three pairs of the two semiconductor elements 12A and 12B are connected in series between the metal blocks 14A and 14B. The power module 500 further includes frame members 502 disposed between the semiconductor elements 12A and the metal blocks 14A, and frame members 503 disposed between the semiconductor elements 12B and the metal blocks 14C, 14D and 14E. The frame members 502 include block members 506, and the frame members 503 include spring members 504. The spring members 504 are similar to the spring members 20A and 20B as described above. One of the spring members 504 and one of the block members 506 are connected to each pair of the semiconductor elements 12A and 12B disposed between the metal blocks 14A and 14B.

The semiconductor elements 12B that are connected to the upper surface of the metal block 14B via the solders 18 are connected to the metal blocks 14C, 14D and 14E via the spring members 504. The semiconductor elements 12A that are connected to the upper surface of the metal blocks 14C, 14D and 14E via the solders 18 are connected to the metal block 14A via the block members 506.

The spring members 504 have similar configuration to that of the spring members 20 as described above. The block members 404 as described above may be provided instead of the spring members 504. The block members 506 are made of metallic materials having high heat transfer performance such as copper. The block members 506 are formed in block shapes. Each of the block members 506 has a single-layered block configuration and is not divided. The block members 506 are different from the divided block members 404 as described above in that the block members 506 are not divided. The one block member 506 is provided for each of the semiconductor elements 12A. The block members 506 have smaller surface areas than that of the metal blocks 14A to 14E.

Lower ends of the spring members 504 are connected to the semiconductor elements 12B via the solders 22. Upper ends of the spring members 504 are connected to the metal blocks 14C, 14D and 14E via the solders 24. Distances between the semiconductor elements 12B and the metal blocks 14C, 14D and 14E can be adjusted by expansion or the contraction of the spring members 504. Lower ends of the block members 506 are connected to the semiconductor elements 12A via the solders 22. Upper ends of the block members 506 are connected to the metal block 14A via the solders 24. Before being molded by the molded resin 32, natural lengths of the spring members 504 in a stack direction are set to lengths that make the distance between the outer surfaces of the cooling members 26A and 26B shorter than corresponding distance of the power module 500 after being molded by the molded resin 32.

Accordingly, it becomes possible to manufacture the power module 500 which has the intended length by supplying the molding resin into the molding die 34 in a state where the spring members 504 included in the structural body 502 between the cooling blocks 26A and 26B are expanded by the molding die 34. The spring members 504 are expanded in a state where the structural body is inserted into the molding die 34. Thus, similar advantageous effects to those of the embodiments as illustrated in FIGS. 1 to 8 can be obtained according to the exemplary variation as illustrated in FIG. 9.

According to the exemplary variation as illustrated in FIG. 9, the upper three frame members 502 include the block members 506 that are not divided in the stack direction. The heat capacities of the block members 506 are greater than those of the spring members 20A and 20B as described above. According to the configuration of the upper three frame members 502 including the block members 506 and the lower three frame members 503 including the spring members 504, it becomes possible to obtain higher heat transfer performance than that of the configuration of the frame members 16 including the spring members 20A and 20B connected in series and the configuration of the frame members 402 including the block pieces 406A to 406C. As a result, according to the exemplary variation as illustrated in FIG. 9, it becomes possible to improve the heat transfer performance, particularly heat transfer performance between the semiconductor elements 12A and 12B and the cooling blocks 26A and 26B, compared with the first and second embodiments.

According to the exemplary variation as illustrated in FIG. 9, before being molded by the molded resin 32, the natural lengths of the spring members 504 in a stack direction are set to lengths that make the distance between the outer surfaces of the cooling members 26A and 26B shorter than corresponding distance of the power module 500 after being molded by the molded resin 32. However, before being molded by the molded resin 32, the natural lengths of the spring members 504 in a stack direction are set to lengths that make the distance between the outer surfaces of the cooling members 26A and 26B longer than corresponding distance of the power module 500 after being molded by the molded resin 32.

According to the exemplary variation as illustrated in FIG. 9, in a case where the spring-like members such as the spring members 20A or 20B are disposed between the metal blocks 14A and 14B and the semiconductor elements 12A and/or 12B, heat generated by the semiconductor elements 12A and/or 12B is conducted to the metal blocks 14A and 14B via the spring-like members. If the spring-like members as described above are disposed in the power module having the multistage structures in which the semiconductor elements 12A and 12B are connected to the metal blocks 14A and 14B via the solders 18, the heat generated by the semiconductor elements 12A and 12B is conducted directly to the metal blocks 14A and 14B via the solders 18. As a result, the enhanced heat transfer performance is obtained.

In the configuration where the one spring member 504 and the one block member 506 are connected in series between the metal blocks 14A and 14B as illustrated in FIG. 9, it becomes possible to obtain the enhanced heat transfer performance, if the spring members 504 are disposed between the semiconductor elements 12B and the metal blocks 14C, 14D and 14E, and the block members 506 are disposed between the semiconductor elements 12A and the metal blocks 14C, 14D and 14E via the solders 18.

According to the first and second embodiments, the spring members 20 or the block members 404 are disposed on one side of the semiconductor elements 12A and 12B. The spring members 20A and 20B or the block members 404 may be disposed on both sides of the semiconductor elements 12A and 12B.

Although the three pairs of the semiconductor elements 12A and 12B are disposed in parallel between the metal blocks 14A and 14B in the power module 10 or the like of the first and second embodiments as described above, the number of the pairs of the semiconductor elements 12A and 12B disposed between the metal blocks 14A and 14B are not limited to three. Plural pairs of the semiconductor elements 12A and 12B may be disposed in parallel between the metal blocks 14A and 14B. Otherwise, the one semiconductor element 12A or 12B may be disposed between the metal blocks 14A and 14B. More than three semiconductor elements may be disposed in series between the metal blocks 14A and 14B in the stack direction. Otherwise, the one semiconductor element 12 may be disposed between the metal blocks 14A and 14B in the stack direction, or the plural semiconductor elements 12 may be disposed in parallel to each other between the metal blocks 14A and 14B. In the latter case, for example, three semiconductor elements 12 are connected in parallel to each other between the metal blocks 14A and 14B.

Figure 10:
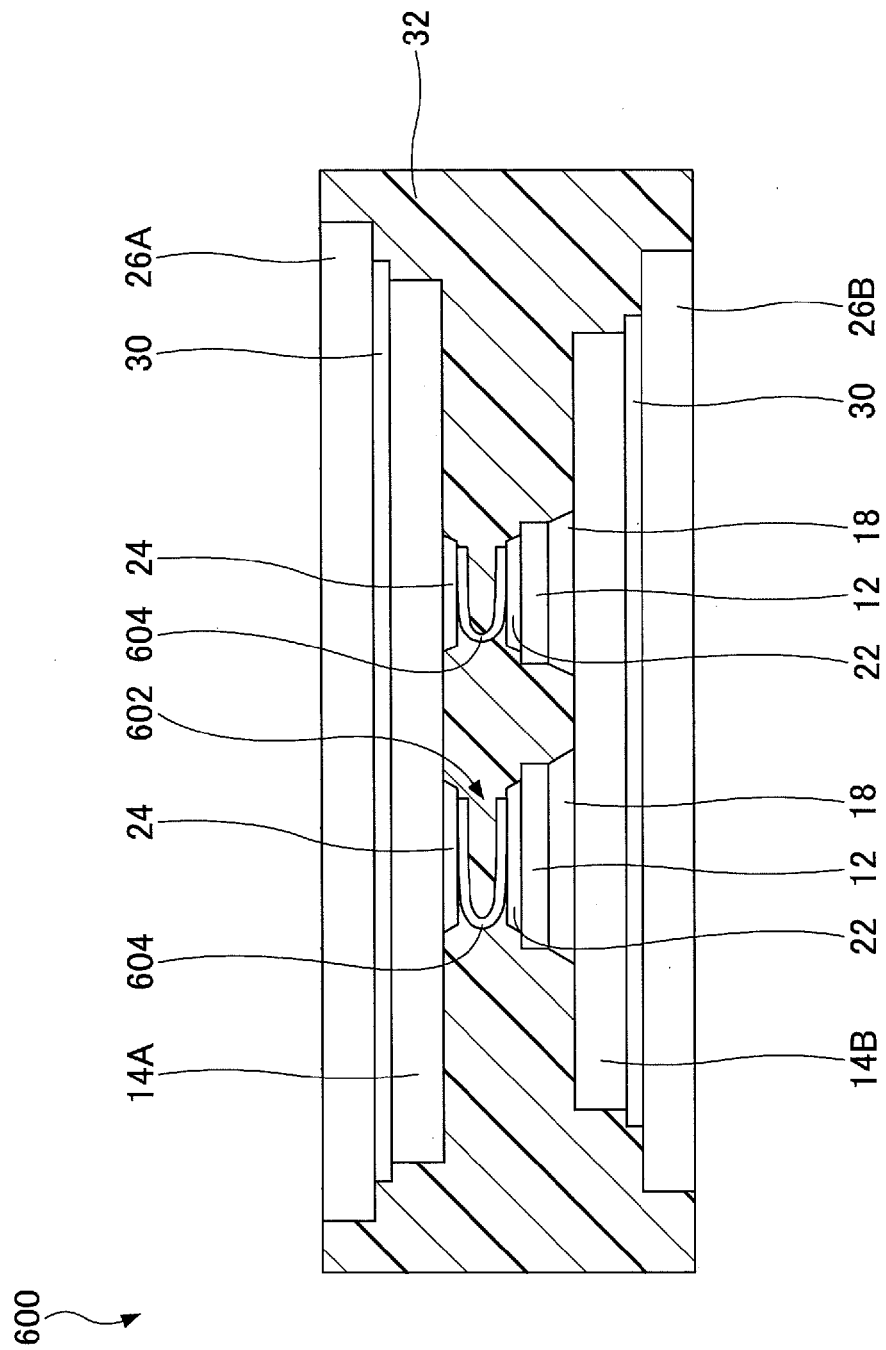
FIG. 10 is a cross-sectional view of a power module according to another exemplary variation of the second embodiment of the present invention.

For example, in a power module 600 as illustrated in FIG. 10, the two semiconductor elements 12 are connected in parallel to each other between the metal blocks 14A and 14B. In the power module 600, the semiconductor elements 12 are connected to the metal block 14B via the solders 18. The other sides of the semiconductor elements 12 are connected to the metal block 14A via frame members 602 including spring members 604. Lower ends of the spring members 604 are connected to the semiconductor elements 12 via the solders 22. Upper ends of the spring members 604 are connected to the metal block 14A via the solders 24.

In a case where two semiconductor elements 12 are connected in parallel between the metal blocks 14A and 14B, it is preferable to dispose at least one spring member 604 on the upper side or the lower side of the one semiconductor element 12 and to dispose at least one spring member 604 on the upper side or the lower side of the other semiconductor element 12. In a case where two or more pairs of the semiconductor elements 12 are disposed in parallel between the metal blocks 14A and 14B, single spring member 20 may be disposed on either side of single semiconductor element 12 of each of two pairs of the semiconductor elements 12 located on both ends among two or more pairs of the semiconductor elements 12. In this case, the spring member 604 may not be disposed on any semiconductor elements 12 of the pair(s) of the semiconductor elements 12 except for the pairs located on both ends among two or more pairs.

According to the first and second embodiments as described above, the spring members 20 that can be elastically deformed in the stack direction or the slidable pieces 406A to 406C that can be elastically deformed in the stack direction and relatively slide to the width direction are used as a distance adjusting part which adjusts the distance between the outer surfaces of the cooling blocks 26A and 26B and is included in the frame member. The present embodiments are not limited to the configuration as described above. A plastic member which has plasticity and can be plastically deformed in the stack direction may be used as the distance adjusting part.

According to the exemplary variation as described above, the plastic member can be plastically deformed by being pulled or pressed by the molding die during the molding process. Distances between the semiconductor elements 12A and the metal blocks 14A, 14B, 14C, 14D and 14E can be adjusted by the plastic member. Distances between the metal block 14A and the metal blocks 14C, 14D and 14E and/or distances between the metal block 14B and the metal blocks 14C, 14D and 14E can be adjusted by plastic deformation of the plastic member. The plastic member is deformable between the cooling members 26A and 26B. Accordingly, it becomes possible to manufacture the power module which has the intended length by supplying the molding resin into the molding die 34 in a state where the plastic member included in the structural body between the cooling blocks 26A and 26B is expanded or contracted by being pulled or pressed by the molding die 34. The plastic member is expanded or contracted in the stack direction in a state where the structural body is inserted into the molding die 34.

In the first and second embodiments as described above, the lower surfaces of the semiconductor elements 12B are connected to the upper surface of the metal block 14B via the solders 18, and the upper surfaces of the semiconductor elements 12B are connected to the metal blocks 14C, 14D and 14E via the spring members 20B or the block members 404B. Further, the lower surface of the semiconductor elements 12A are connected to the upper surfaces of the metal blocks 14C, 14D and 14E via the solders 18, and the upper surfaces of the semiconductor elements 12A are connected to the lower surface of the metal block 14A via the spring members 20A or the block members 404A. The present embodiments are not limited to the configurations as described above. Locations of the semiconductor elements 12A and locations of the spring members 20A may be interchanged. Similarly, locations of the semiconductor elements 12B and locations of the spring members 20B may be interchanged. The semiconductor elements 12A and 12B may be connected to the metal blocks 14C, 14D and 14E, and may be connected to the metal blocks 14A and 14B via the spring members or the conductive members.

Figure 11:
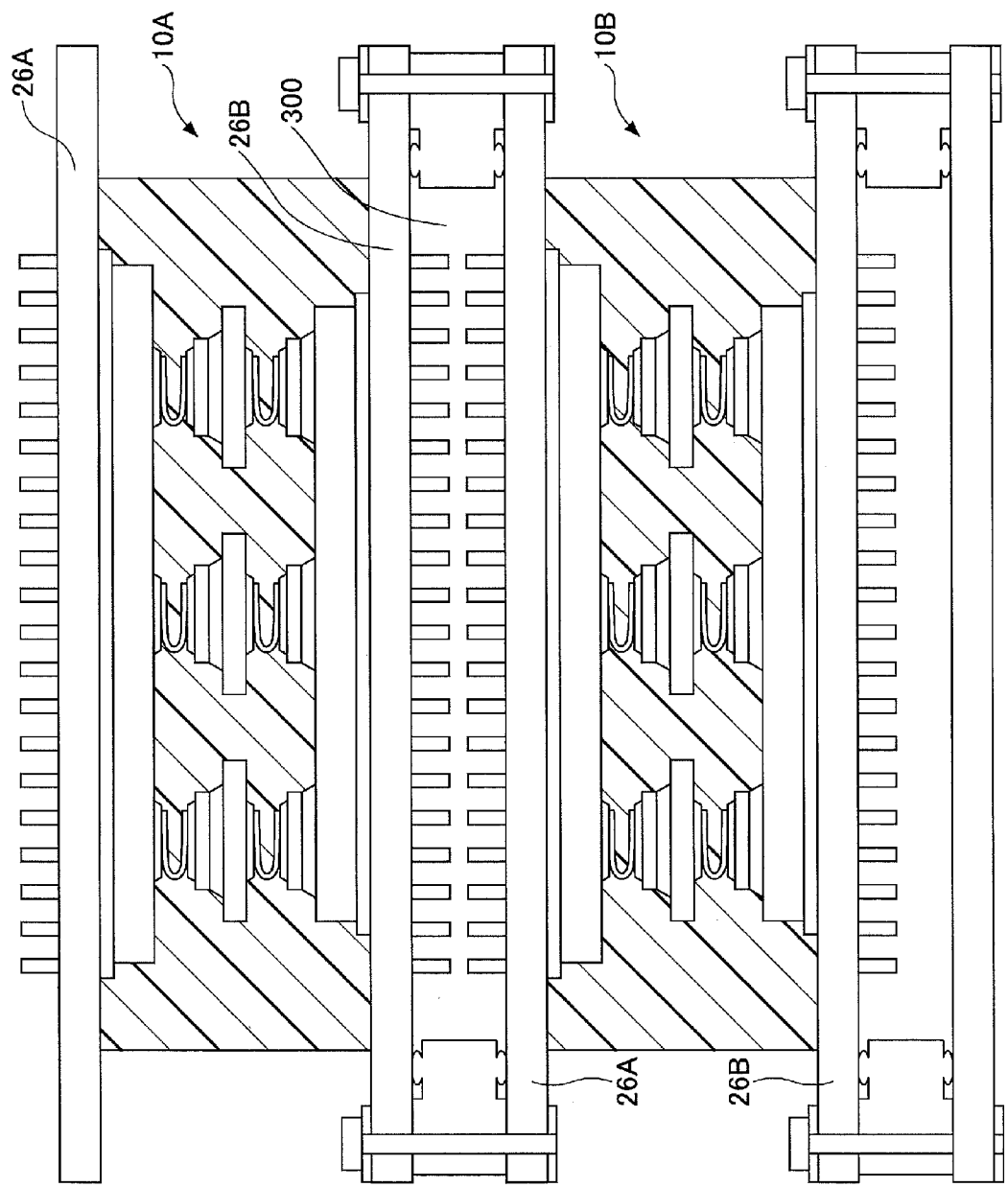
FIG. 11 is a cross-sectional view of a power module according to yet another exemplary variation of the embodiment of the present invention.

Although, as described above, the power modules 100 and 400 use the air as the coolant which performs the heat exchange at the cooling blocks 26A and 26B, the heat exchange is performed by using a flow path 700, through which water is flowing, disposed between the cooling block 26B of one power module 10A and the cooling block 26A of the other power module 10B as illustrated in FIG. 11.

The directions such as "upper" and "lower" as described above are illustrative only and used only for describing relative locations of the configuration elements such as the semiconductor elements 12, 12A, 12B, the metal plates 14A and 14B, the spring members 20 and the cooling blocks 26A and 26 or the like as illustrated in FIGS. 1 to 11.

The descriptions of a power module, a method for manufacturing the power module and a molding die used for molding the power module of exemplary embodiments have been provided heretofore. The present invention is not limited to these embodiments, but various variations and modifications may be made without departing from the scope of the present invention.

The present application is based on Japanese Priority Application No. 2011-184080 filed on Aug. 25, 2011 with the Japanese Patent Office and Japanese Priority Application No. 2012-130772 filed on Jun. 8, 2012 with the Japanese Patent Office, the entire contents of which are hereby incorporated herein by reference.

What is claimed is:

1. A power module comprising:
   a semiconductor element;
   a first cooling member and a second cooling member configured to sandwich the semiconductor element therebetween;
   a frame member configured to support the semiconductor element between the first cooling member and the second cooling member; and
   a molded resin disposed between the first cooling member and the second cooling member,
   wherein the frame member includes an adjusting member which adjusts a distance between the first cooling member and the second cooling member,
   wherein the adjusting member includes plural block pieces that are stacked between the first cooling member and the second cooling member in a stack direction of the semiconductor element, the first cooling member and the second cooling member, and wherein the block pieces are relatively slidable with each other in a direction orthogonal to the stack direction.

2. The power module as claimed in claim 1, wherein the plural block pieces relatively slide with each other in the direction orthogonal to the stack direction in a state where the plural block pieces are pressed by a molding die during a molding process.

* * * * *